United States Patent
Jung

(10) Patent No.: US 11,627,654 B2
(45) Date of Patent: Apr. 11, 2023

(54) ELECTRONIC DEVICE INCLUDING HEAT DISSIPATION STRUCTURE

(71) Applicant: SAMSUNG ELECTRONICS CO., LTD., Suwon-si (KR)

(72) Inventor: Chunghyo Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 263 days.

(21) Appl. No.: 16/999,487

(22) Filed: Aug. 21, 2020

(65) Prior Publication Data
US 2021/0068244 A1  Mar. 4, 2021

(30) Foreign Application Priority Data
Sep. 3, 2019 (KR) .................. 10-2019-0109112

(51) Int. Cl.
*H05K 1/02* (2006.01)
*H05K 9/00* (2006.01)

(52) U.S. Cl.
CPC ......... *H05K 1/0203* (2013.01); *H05K 1/0231* (2013.01); *H05K 9/009* (2013.01)

(58) Field of Classification Search
CPC ...... G06F 1/1626; G06F 1/1656; G06F 1/203; H01L 23/3735; H01L 23/3736; H01L 23/42; H01L 23/552; H04M 1/0202; H04M 1/026; H05K 1/0203; H05K 1/0216; H05K 1/0231; H05K 1/02; H05K 2201/066;
(Continued)

(56) References Cited

U.S. PATENT DOCUMENTS 9,877,830 B2   1/2018  Lim et al.
2011/0088917 A1*  4/2011  Lee ..................... F16L 5/14
                                                      169/48
(Continued)

FOREIGN PATENT DOCUMENTS

CN    105873417    2/2019
EP    3 255 967    12/2017
(Continued)

OTHER PUBLICATIONS

Search Report and Written Opinion dated Nov. 23, 2020 in counterpart International Patent Application No. PCT/KR2020/011024.
(Continued)

*Primary Examiner* — Timothy J Thompson
*Assistant Examiner* — Guillermo J Egoavil
(74) *Attorney, Agent, or Firm* — Nixon & Vanderhye P.C.

(57) ABSTRACT

An electronic device according to various embodiments may include: a circuit board; an electrical element disposed on an upper surface of the circuit board; a shield can surrounding at least a portion of the electrical element and having a first opening provided through a portion of the shield can facing the electrical element; a shielding sheet including a shielding layer disposed on at least a portion of the shield can and a support layer disposed on an upper surface of the shielding layer and including a second opening corresponding to the first opening; and a first heat transfer member comprising a heat dissipating material having at least a portion disposed inside the second opening and at least one surface in contact with the shielding layer.

20 Claims, 16 Drawing Sheets

(58) Field of Classification Search
CPC ..... H05K 2201/10371; H05K 7/20445; H05K 9/0032; H05K 9/009; H05K 9/00
USPC .................................................. 361/720, 704
See application file for complete search history.

(56) References Cited

U.S. PATENT DOCUMENTS

| | | |
|---|---|---|
| 2015/0220122 A1 | 8/2015 | Rhee et al. |
| 2017/0367175 A1 | 12/2017 | Lai |
| 2018/0228063 A1 | 8/2018 | Dixon et al. |
| 2018/0233428 A1 | 8/2018 | Kim |
| 2018/0288908 A1 | 10/2018 | Lee et al. |
| 2020/0116435 A1 | 4/2020 | Lee et al. |
| 2020/0389999 A1 | 12/2020 | Lee et al. |

FOREIGN PATENT DOCUMENTS

| | | | | |
|---|---|---|---|---|
| EP | 3 419 398 | 12/2018 | | |
| JP | 2005-064266 | 3/2005 | | |
| JP | 2017-170769 | 9/2017 | | |
| KR | 10-2001-0104439 | 11/2001 | | |
| KR | 10-2018-0094831 | 8/2018 | | |
| KR | 20180094831 A | * 8/2018 | ............... | C09K 5/14 |
| KR | 10-2018-0109615 | 10/2018 | | |
| WO | 2019/164367 | 8/2019 | | |
| WO | WO-2019164367 A1 | * 8/2019 | ............... | C09K 5/14 |

OTHER PUBLICATIONS

Search Report and Written Opinion dated Jun. 1, 2022 in counterpart European Patent Application No. 20860059.3.

* cited by examiner

ELECTRONIC DEVICE INCLUDING HEAT DISSIPATION STRUCTURE

CROSS-REFERENCE TO RELATED APPLICATION

This application is based on and claims priority under 35 U.S.C. § 119 to Korean Patent Application No. 10-2019-0109112, filed on Sep. 3, 2019, in the Korean Intellectual Property Office, the disclosure of which is incorporated by reference herein in its entirety.

BACKGROUND

Technical Field

The disclosure relates to a heat dissipation structure for shielding electromagnetic waves of an electrical element disposed inside an electronic device and/or for dissipating heat, and an electronic device including the same.

Description of Related Art

With the remarkable development of information and communication technologies and semiconductor technology, the spread and use of various electronic devices are rapidly increasing. Particularly, recent electronic devices are developed to be communicable while being carried around.

The electronic device may refer, for example, to a device that performs a specific function according to a program installed on a home appliance, an electronic notebook, a portable multimedia player, a mobile communication terminal, a tablet PC, a video/sound device, a desktop/laptop computer, a vehicle navigation device, etc. For example, these electronic devices can output stored information as audio and/or video. As the integration degree of electronic devices increase and ultra-high-speed and large-capacity wireless communication becomes common, various functions can be installed in one electronic device such as a mobile communication terminal. For example, not only communication functions, but also entertainment functions such as games, multimedia functions such as music/video playback, communication and security functions for mobile banking, and functions such as schedule management and electronic wallets are integrated in one electronic device. These electronic devices have been miniaturized so that users can conveniently carry the devices.

In general, an electronic device includes various electronic components and a printed circuit board (PCB) inside a bracket on which a component is mounted. Some circuit electrical elements mounted on the printed circuit board (PCB) generate electromagnetic waves and/or heat, and the generated electromagnetic waves and/or heat may cause malfunction and deterioration of the electronic device.

Various heat dissipation members may be used in order to dissipate heat generated inside the electronic device. However, it is difficult to attach a heat dissipation member directly to an electrical element (e.g., AP) due to the limitation on EMI shielding, insulation, thickness, and strength. In addition, a subsidiary material having a large heat capacity and a low heat resistance should be used in order to increase thermal density of an electrical element (e.g., AP), but it is difficult to design such a material.

SUMMARY

Embodiments of the disclosure may provide an electronic device including a heat dissipation structure to shield electromagnetic waves of at least one electrical element of the electronic device and to efficiently disperse heat.

An electronic device according to various example embodiments may include: a circuit board; an electrical element disposed on an upper surface of the circuit board; a shield can surrounding at least a portion of the electrical element and including a first opening provided through a portion thereof and facing the electrical element; a shielding sheet including a shielding layer disposed on at least a portion of the shield can and a support layer disposed on an upper surface of the shielding layer, the shielding sheet including a second opening corresponding to the first opening; and a first heat transfer member comprising a heat dissipating material (e.g., thermal interface material), at least a portion of which is disposed inside the second opening and at least one surface of the first heat transfer member being in contact with the shielding layer.

An electronic device according to various example embodiments may include: a housing; a circuit board disposed inside the housing; an electrical element disposed on an upper surface of the circuit board; a shield can surrounding at least a portion of the electrical element and including a first opening provided through a portion thereof and facing the electrical element; a shielding sheet covering the first opening of the shield can and including a recess facing at least a portion of the first opening; and a first heat transfer member comprising a heat dissipating material (e.g., thermal interface material) stably disposed in the recess of the shielding sheet and configured to guide a heat transfer path, wherein heat generated in the electrical element is directed to the housing.

An electronic device according to various example embodiments may include: a circuit board; an electrical element disposed on an upper surface of the circuit board; a bracket; a shielding sheet disposed between the electrical element and the bracket, the shielding sheet including a shielding layer and a support layer, the support layer being disposed on an upper surface of the shielding layer and including an opening; and a first heat transfer member comprising a heat transferring material (e.g., thermal interface material), at least a portion of which is disposed in the opening and at least one surface of which is in contact with the shielding layer.

An electronic device according to various example embodiments may provide a heat dissipation structure including a shielding function and a heat dissipation function.

A heat dissipation structure according to various example embodiments may provide efficient heat dissipation performance by providing a heat transfer member and/or a shielding layer disposed in contact with an electrical element disposed on a circuit board.

A heat dissipation structure according to various example embodiments may provide an efficient heat transfer path by excluding a subsidiary material having high heat resistance on a path of heat generated in an electrical element and reducing a thickness between a bracket and the electrical element.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
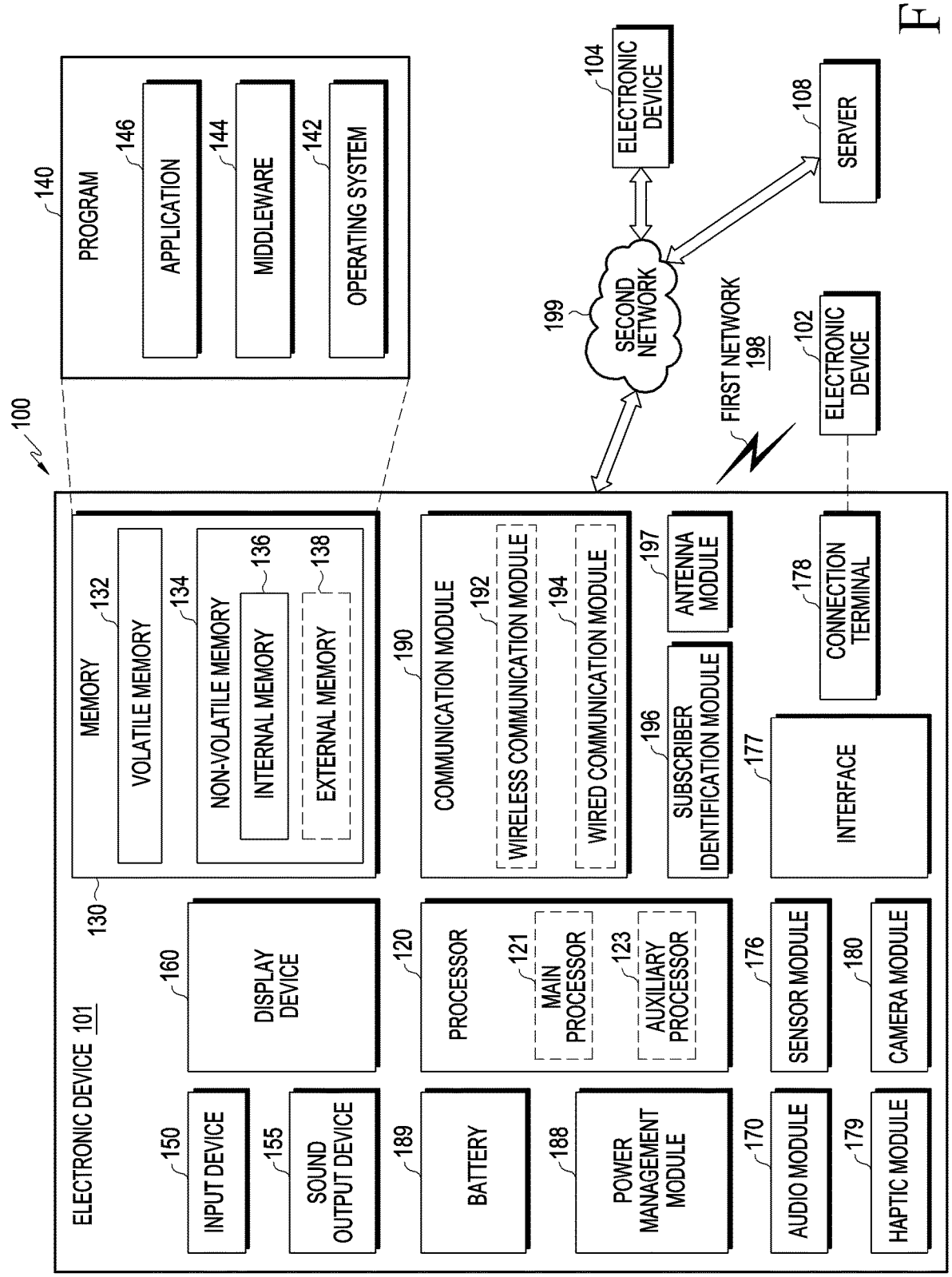
FIG. 1 is a block diagram illustrating an example electronic device in a network environment, according to various embodiments.

FIG. 1 is a block diagram illustrating an example electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment, the electronic devices are not limited to those described above.

It should be appreciated that various embodiments and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code made by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
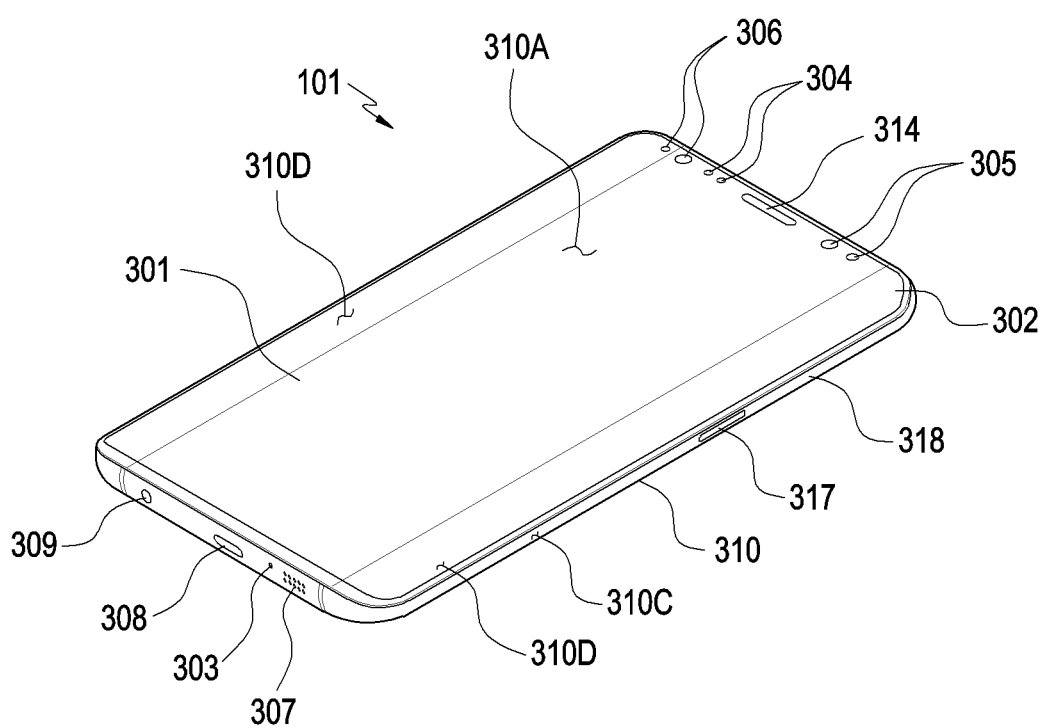
FIG. 2 is a front perspective view illustrating an example electronic device according to various embodiments.
Figure 3:
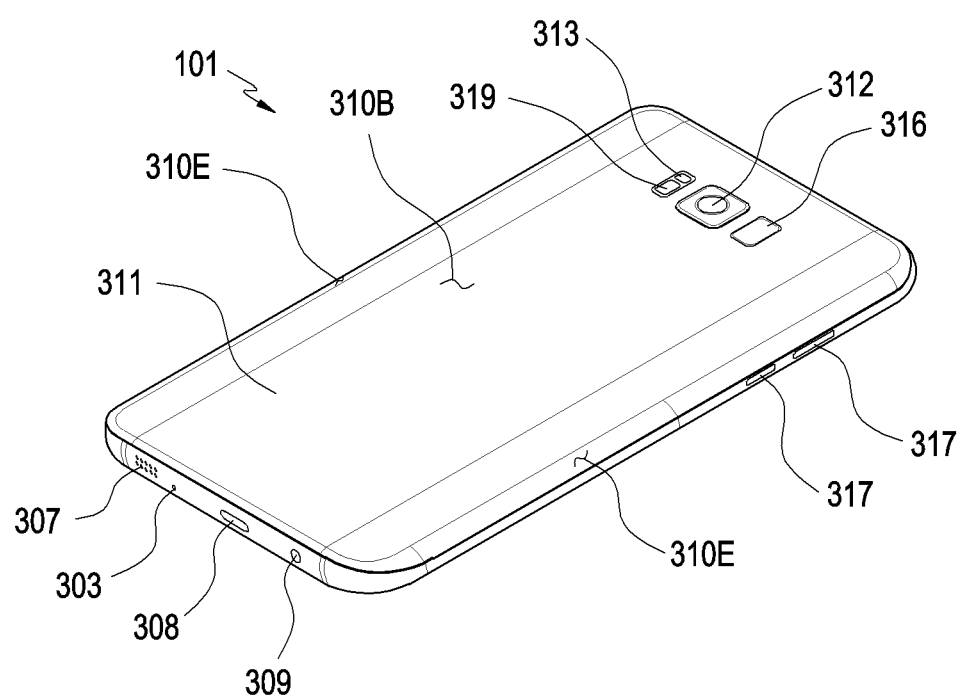
FIG. 3 is a rear perspective view illustrating an example electronic device according to various embodiments.

FIG. 2 is a front perspective view illustrating an example electronic device 101 according to various embodiments and FIG. 3 is a rear perspective view illustrating the electronic device 101 according to various embodiments.

Referring to FIGS. 2 and 3, the electronic device 101 according to an embodiment may include a housing 310 including a first surface 310A (or front surface), a second surface 310B (or rear surface), and a side surface 310C surrounding a space between the first surface 310A and the second surface 310B. In another embodiment (not shown), a structure configuring a portion of the first surface 310A of FIG. 2, the second surface 310B, and the side surfaces 310C may be referred to as a housing. According to an example embodiment, the first surface 310A may be configured by a front plate 302 (e.g., a glass plate, or a polymer plate) having at least a portion which is substantially transparent. The second surface 310B may be configured by a rear plate 311 which is substantially opaque. The rear plate 311 may be configured by, for example, coated or colored glass, ceramic, a polymer, a metal (e.g., aluminum, stainless steel (STS), or magnesium), or a combination of at least two thereof. The side surface 310C may be configured by a side bezel structure 318 (or "side surface member") that is coupled to the front plate 302 and the rear plate 311 and includes a metal and/or a polymer. In an embodiment, the rear plate 311 and side bezel structure 318 may be integrally configured and include the same material (e.g., a metal material such as aluminum).

In the illustrated embodiment, the front plate 302 may include two first regions 310D, which are arranged at opposite ends of the longer edges of the front surface plate 302, respectively, and are curved and seamlessly extend from the first surface 310A toward the rear plate 311. In the illustrated embodiment (see FIG. 3), the rear plate 311 may include two second regions 310E, which are arranged at opposite ends of the longer edges thereof, respectively, and are curved and seamlessly extend from the second surface 310B toward the front plate 302. In an embodiment, the front plate 302 (or the rear plate 311) may include only one of the first regions 310D (or the second regions 310E). In another embodiment, the electronic device may not include one of the first regions 310D or the second regions 310E. In the above embodiments, when viewed from the side of the electronic device 101, the side bezel structure 318 may have a first thickness (or width) on a side surface including no the first regions 310D or the second regions 310E and may have a second thickness thinner than the first thickness on a side surface including the first regions 310D or the second regions 310E.

According to an example embodiment, the electronic device 101 may include at least one of a display 301, audio modules 303, 307, and 314, sensor modules 304, 316, and 319, camera modules 305, 312, and 313, key input devices 317, a light-emitting element(s) 306, and connector holes 308 and 309. In an embodiment, at least one of the elements (e.g., key input devices 317 or the light-emitting element 306) may be omitted from the electronic device 101 or another element may be added to the electronic device 101.

According to an example embodiment, the display 301 may be visually exposed (e.g., viewable), for example, through a significant portion of the front plate 302. In an embodiment, at least a portion of the display 301 may be exposed through the front plate 302 forming the first surface 310A and the first regions 310D of the side surface 310C. In an embodiment, the edge of the display 301 may be configured to have substantially the same shape as the outer edge of the front plate 302 adjacent thereto. In another embodiment (not shown), in order to expand an area where the display 301 is exposed, the display 301 may be configured such that the distance between the outer edge of the display 301 and the outer edge of the front plate 302 is maintained to be substantially the same.

In another embodiment (not shown), a portion of a screen display region of the display 301 may have a recess or opening disposed thereon and include at least one of the audio module 314, the sensor module 304, the camera module 305, and the light-emitting element 306 which are aligned with the recess or the opening. In another embodiment (not shown), the rear surface of the screen display region of the display 301 may include at least one of the audio module 314, the sensor module 304, the camera module 305, a fingerprint sensor 316, and the light-emitting element 306. In another embodiment (not shown), the display 301 may be coupled or adjacent to a touch sensing circuit, a pressure sensor capable of measuring the intensity (pressure) of touch, and/or a digitizer for detecting a magnetic field type stylus pen. In an embodiment, at least a portion of the sensor modules 304 and 319 and/or at least a portion of the key input device 317 may be disposed on the first regions 310D and/or the second regions 310E.

According to an example embodiment, the audio modules 303, 307, and 314 may include, for example, a microphone hole 303 and speaker holes 307 and 314. A microphone for acquiring external sound may be disposed inside the microphone hole 303, and in an embodiment, a plurality of microphones may be arranged inside thereof so as to sense the direction of sound. The speaker holes 307 and 314 may include an external speaker hole 307 and a call receiver hole 314. In an embodiment, the speaker holes 307 and 314 and the microphone hole 303 may be implemented by one hole, or a speaker may be provided without the speaker holes 307 and 314 (e.g., piezo speaker). The audio modules 303, 307, and 314 are not limited to the above structure, and may be variously designed and changed according to a structure of the electronic device 101 by mounting only a portion of the audio modules, adding a new audio module, or the like.

According to an example embodiment, the sensor modules 304, 316, and 319 may generate an electrical signal or a data value corresponding to, for example, an internal operating state of the electronic device 101 or an external environmental state. The sensor modules 304, 316, and 319 may include, for example, a first sensor module 304 (e.g., proximity sensor) and/or a second sensor module (not shown) (e.g., fingerprint sensor) disposed on the first surface 310A of the housing 310, and/or a third sensor module 319 (e.g., HRM sensor) and/or a fourth sensor module 316 (e.g., fingerprint sensor) disposed on the second surface 310B of the housing 310. The fingerprint sensor may be disposed not only on the first surface 310A (e.g., display 301) of the housing 310 but also on the second surface 310B thereof. The electronic device 101 may further include a sensor module (not shown), for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor. The sensor modules 304, 316, and 319 are not limited to the above structures, and may be variously designed and changed according to a structure of the electronic device 101 by mounting only a portion of the sensor modules, adding a new sensor module, or the like.

According to an example embodiment, the camera modules 305, 312, and 313 may include, for example, a first camera device 305 disposed on the first surface 310A of the electronic device 101, a second camera device 312 and/or a flash 313 disposed on the second surface 310B thereof. The camera modules 305 and 312 may include one or more lenses, an image sensor, and/or an image signal processor. The flash 313 may include, for example, a light-emitting diode or a xenon lamp. In an embodiment, two or more lenses (infrared camera, wide-angle and telephoto lenses) and image sensors may be disposed on one surface of the electronic device 101. The camera modules 305, 312, and 313 are not limited to the above structure, and may be variously designed and changed according to a structure of the electronic device 101 by mounting only a portion of the camera modules, adding a new camera module, or the like.

According to an example embodiment, the key input devices 317 may be, for example, disposed on the side surface 310C of the housing 310. In another embodiment, the electronic device 101 may not include one or all of the key input devices 317 mentioned above, and the key input device 317 that is not included on the electronic device 101 may be implemented as another form of a soft key or the like on the display 301. In an embodiment, the key input devices may include the sensor module 316 disposed on the second surface 310B of the housing 310.

According to an example embodiment, the light-emitting device 306 may be disposed, for example, on the first surface 310A of the housing 310. The light-emitting element 306 may provide, for example, state information of the electronic device 101 in the form of light. In another embodiment, the light-emitting device 306 may provide, for example, a light source interworking with the operation of the camera module 305. The light-emitting element 306 may include, for example, an LED, an IR LED, and a xenon lamp.

According to an example embodiment, the connector holes 308 and 309 may include, for example, a first connector hole 308 that can receive a connector (e.g., USB connector) for transmitting and receiving power and/or data to and from an external electronic device and/or a second connector hole 309 (e.g., earphone jack) that can receive a connector for transmitting and receiving an audio signal to and from an external electronic device. The connector holes 308 and 309 are not limited to the above structure and may be variously designed and changed according to a structure of the electronic device 101 by mounting only a portion of the connector holes, adding a new connector hole, or the like.

Figure 4:
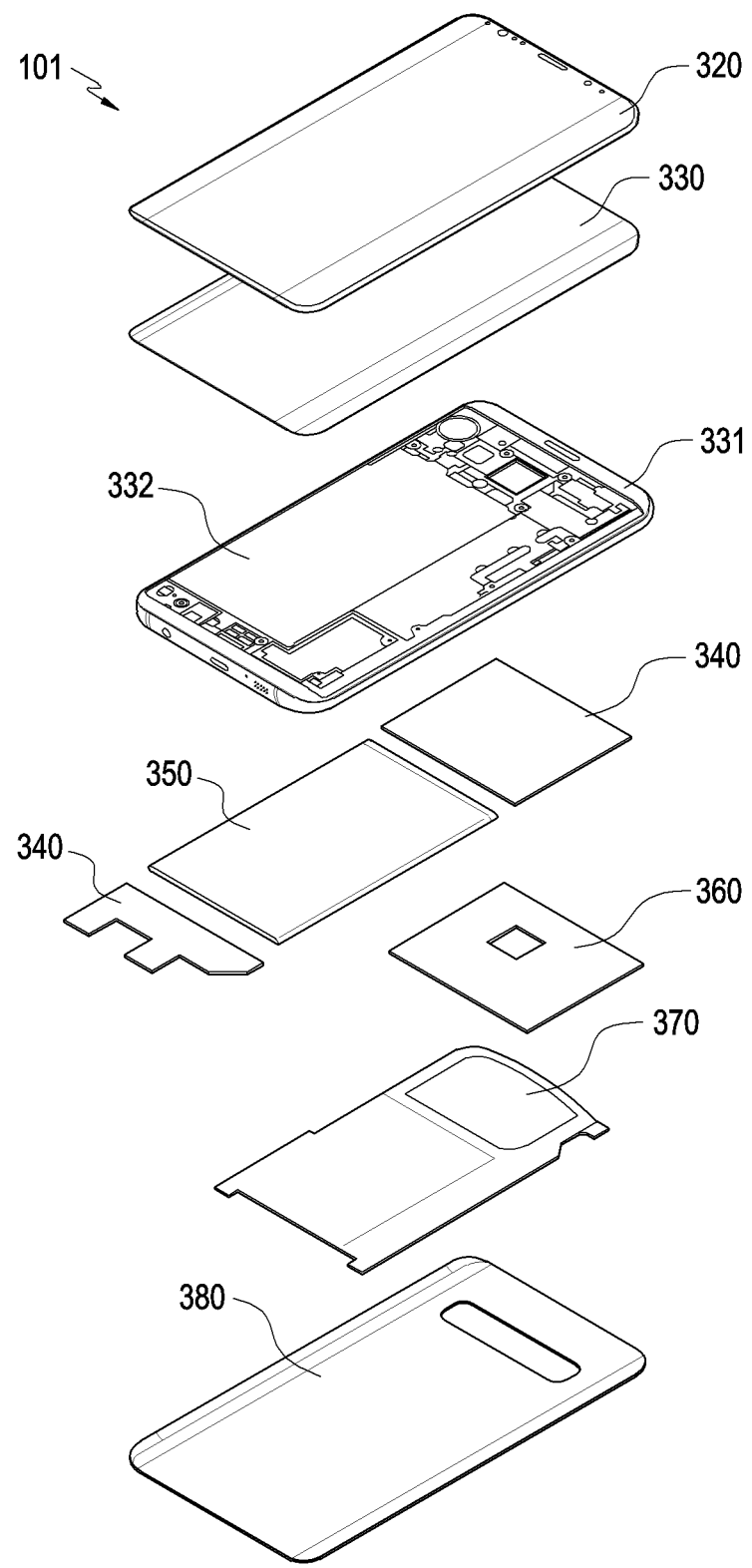
FIG. 4 is an exploded perspective view illustrating an example electronic device according to various embodiments.

FIG. 4 is an exploded perspective view illustrating the electronic device 101 according to various embodiments.

Referring to FIG. 4, the electronic device 101 according to various embodiments (e.g., the electronic device 101 of FIGS. 1, 2 and 3) may include a side bezel structure 331, a first support member 332 (e.g., bracket), a front plate 320, a display 330, a printed circuit board 340, a battery 350, a second support member 360 (e.g., rear case), an antenna 370, and a rear plate 380. In an embodiment, at least one of the elements (e.g., the first support member 332 or the second support member 360) may be omitted from the electronic device 101 or another element may be added to the electronic device 101. At least one of the elements of the electronic device 101 may be the same as or similar to at least one of the elements of the electronic device 101 of FIG. 2 or 3 and overlapping description thereof will be omitted.

According to various embodiments, the first support member 332 may be disposed inside the electronic device 101 and connected to the side bezel structure 331 or may be integrally configured with the side bezel structure 331. The first support member 332 may be formed of, for example, a metal material and/or a non-metal (e.g., polymer) material. The first support member 332 may have one surface coupled to the display 330 and the other surface coupled to the printed circuit board 340.

The printed circuit board 340 may be equipped with a processor, a memory, and/or an interface. The processor may include, for example, and without limitation, one or more of a central processing unit, an application processor, a graphic processing unit, an image signal processor, a sensor hub processor, a communication processor, or the like.

According to various embodiments, the memory may include, for example, and without limitation, a volatile memory and/or a nonvolatile memory.

According to various embodiments, the interface may include, for example, and without limitation, a high definition multimedia interface (HDMI), a universal serial bus (USB) interface, an SD card interface, and/or an audio interface, or the like. The interface may, for example, electrically or physically connect the electronic device 101 to an external electronic device and may include a USB connector, an SD card/MMC connector, or an audio connector.

According to various embodiments, the battery 350, which is a device for supplying power to at least one element of the electronic device 101, may include, for example, and without limitation, a non-rechargeable primary cell, a rechargeable secondary cell, a fuel battery, or the like. At least a portion of the battery 350 may be disposed on, for example, substantially the same plane as the printed circuit board 340. The battery 350 may be integrally disposed inside the electronic device 101 or may be disposed to be attachable to or detachable from the electronic device 101.

According to various embodiments, the antenna 370 may be disposed between the rear plate 380 and the battery 350. The antenna 370 may include, for example, and without limitation, a near field communication (NFC) antenna, a wireless charging antenna, and/or a magnetic secure transmission (MST) antenna, etc. The antenna 370 may, for example, perform local area communication with an external device or wirelessly transmit and receive power required for charging. In another embodiment, the antenna structure may be configured by the side bezel structure 331 and/or a portion of the first support member 332 or a combination thereof.

Figure 5A:
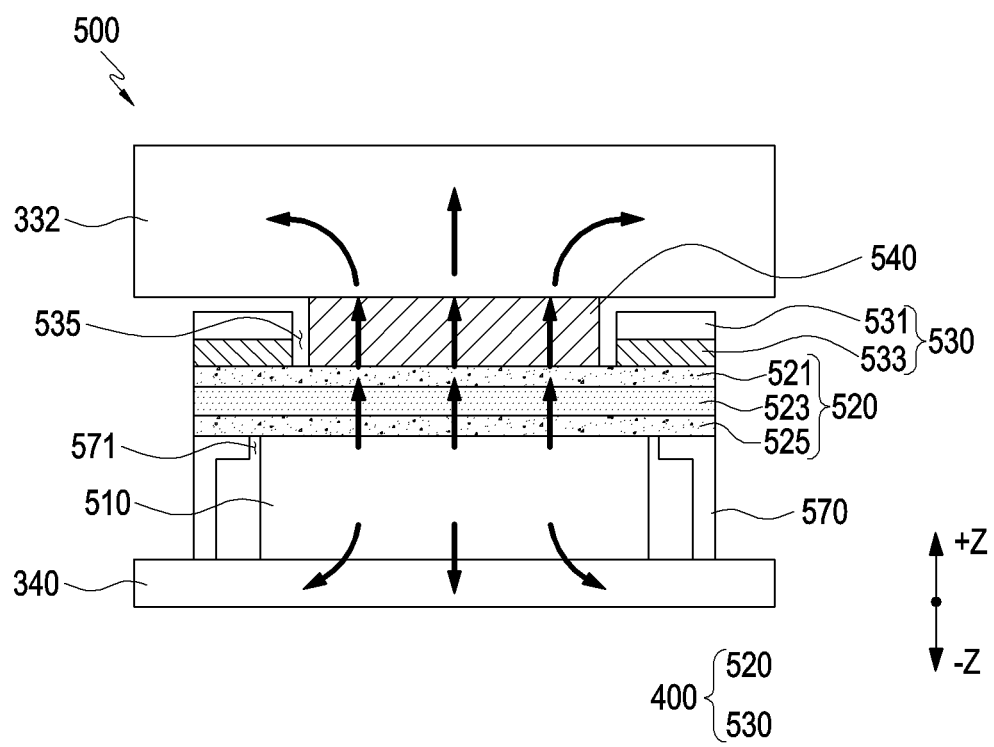
FIG. 5A is a cross-sectional view illustrating an example structure for shielding and dissipating heat around an electrical element, according to various embodiments.

FIG. 5A is a cross-sectional view illustrating an example structure for shielding and dissipating heat around an electrical element according to various embodiments.

According to various embodiments, an electronic device (e.g., the electronic device 101 of FIGS. 1 to 4) may include a circuit board 340, at least one electrical element (e.g., including an electrical circuit) 510, a shield can 570, a shielding sheet 400 (e.g., shielding layer 520, support layer 530), at least one heat transfer member (e.g., first heat transfer member) 540 (e.g., including a heat transfer interface material), and a bracket 332. According to an example embodiment, a configuration of the circuit board 340 and the bracket 332 in FIG. 5A may be partially or entirely the same as a configuration of the printed circuit board 340 and the first support member 332 in FIG. 4.

In FIG. 5A, "+Z or −Z" may indicate the upper and a lower direction when a heat dissipation structure 500 is viewed from the side. In addition, in an example embodiment, "+Z" may refer, for example, to a front direction in which the electrical element 510 disposed inside the electronic device faces a front cover (e.g., the front plate 320 of FIG. 4) and "−Z" may refer, for example, to a rear direction in which the electrical element 510 disposed inside the electronic device faces a rear cover (e.g., the rear plate 380 of FIG. 4).

According to various embodiments, a plurality of electrical elements may be arranged on at least one side surface of the circuit board 340 (e.g., the circuit board 340 of FIG. 4). Some electrical elements (510) of the plurality of electrical elements, which are heat generating sources that generate heat, may include, for example, and without limitation, at least one chip disposed on at least one side surface of the circuit board 340, and may include, for example, and without limitation, at least one of a power management integrated circuit (PMIC), a power amplifier (PAM), an application processor (AP), a communication processor (CP), a charger integrated circuit (IC), or the like. In this example, the electrical element 510 may be the application processor (AP). However, it will be understood that the disclosure is not limited thereto.

According to various embodiments, the shield can 570 may be configured to surround at least a portion of the electrical element 510. According to another embodiment, when the heat dissipation structure 500 of the electronic device is viewed from the top (e.g., when viewed in the −Z direction), the shield can 570 may have a structure having a first opening 571 disposed on a portion where the electrical element 510 faces the shield can 570 or a region where the electrical element 510 and at least a portion of the shield can 570 overlap each other, for example, a region where at least a portion of the electrical element 510, which may be in contact with another material, is located in order to disperse heat generated in the electrical element 510 to the outside. The shield can 570 may be coupled to one surface of the circuit board 340 (e.g., one surface facing in a first direction (+Z)). The shield can 570 may be coupled to at least a portion of one side surface of the circuit board 340 by, for example, and without limitation, a soldering method. For example, the shield can 570 may include an upper surface including the first opening 571 and side surfaces forming a space between an upper surface and the circuit board 340. The first opening 571 may provide a travel path of heat generated in the electrical element 510, and the shield can 570 may be manufactured to have a shape surrounding at least a portion of the electrical element 510 (e.g., closed square loop).

According to an example embodiment, the shielding sheet 400 may include a shielding layer 520 and a support layer 530. The shielding sheet 400 is disposed on one side surface of the electrical element 510 and may serve to prevent and/or reduce electromagnetic waves, which may be generated in the electrical element 510, from affecting other electrical elements (not shown) arranged inside the electronic device.

According to various embodiments, a shielding layer 520 is disposed on at least a portion of the shield can 570. The shielding layer 520 may provide a shielding function against electromagnetic waves which may be generated by the electrical element 510 and a heat conduction function for transferring heat which may be generated by the electrical element 510 to the outside of the electrical element 510. According to an example embodiment, the shielding layer 520 may be disposed to cover at least a portion of the first opening 571 of the shield can 570 to shield electromagnetic waves of the electrical element 510. According to another embodiment, the shielding layer 520 may, for example, be disposed on one side surface (e.g., upper surface) of the shield can 570 along a peripheral portion of the first opening 571 and a portion where the first opening 571 is formed.

According to an example embodiment, the shielding layer 520 may have elasticity to be compressed when pressed by external pressure. Heat generated in the electrical element 510 may be transferred to another layer through the shielding layer 520 after passing through the first opening 571.

According to an example embodiment, the shielding layer 520 may be implemented as a single shielding layer 520 by stacking various layers. For example, the shielding layer 520 may include a shielding film 523 and conductive adhesive films 521 and 525. According to an example embodiment, the shielding film 523 may include, for example, a fiber film having a nanostructure to shield electromagnetic waves. For example, fibers of the fiber film may be formed thin and long by processing based, for example, on the electrospinning method, and the fiber film may be formed by a process in which the fibers thus formed are plated, for example, with copper (Cu), then plated, for example, with nickel (Ni), and finally plated, for example, with copper (Cu) again. The fiber film may be implemented, for example, as a nanostructure configured by overlapping each of the fibers formed by the plating process several times. The shielding film 523 may be configured to have a thickness of approximately 5 to 20 µm. According to an example embodiment, the shielding film 523 may be disposed between the conductive adhesive films 521 and 525. According to an example embodiment, a first conductive adhesive film 521 disposed between the support layer 530 and/or the first heat transfer member 540 and the shielding film 523 may adhere the shielding film 523 to the support layer 530 and/or the first heat transfer member 540. According to an example embodiment, a second conductive adhesive film 525 is disposed between the shielding film 523 and the shield can 570 and/or the electrical element 510, and the adhesive film 525 may adhere the shielding film 523 to the shield can 570 and/or at least a portion of the electrical element 510. When the shielding film 523 and the electrical element 510 are directly adhered by the second conductive adhesive film 525, heat transfer may be more effectively performed compared to when the shielding film 523 and the electrical element 510 are spaced apart from each other or other foreign materials are disposed therebetween. For example, when the shielding film 523 and the electrical element 510 are spaced apart from each other or other foreign matter is disposed therebetween or when an air-gap is formed therebetween, heat transfer may not be performed well. For example, in the case of direct adhesion without other foreign matter or an air-gap, heat transfer may be faster.

According to an example embodiment, the conductive adhesive films 521 and 525 may, for example, have a thickness of approximately 5 µm.

According to various embodiments, the support layer 530 may be disposed between the shielding layer 520 and the bracket 332 and may include a second opening 535 corresponding to the first opening 571. The support layer 530 may support at least a portion of the shielding layer to prevent and/or reduce bending of at least a portion of the shielding layer 520 and may, for example, have a stacked structure including, for example, a copper (Cu) sheet 533 and an insulation sheet 531. The second opening 535 may penetrate a portion of the support layer 530, and the second opening 535 may include at least a portion disposed on a position corresponding to that of the first opening 571. For example, the second opening 535 may be substantially formed as a space in which the first heat transfer member 540 is located.

For example, a travel path of heat may be formed such that heat generated in the electrical element 510 is transferred to the shielding layer 520 through the first opening 571 and a portion of the heat having transferred to the heat conductive member 520 is transferred to the first heat transfer member 540 through the second opening 535 formed through the support layer 530. According to an example embodiment, the support layer 530 may be configured to have a thickness of approximately 15 to 25 µm.

According to various embodiments, the first heat transfer member 540 may be disposed such that at least a portion thereof is disposed inside the second opening 535 of the support layer 530 and at least one surface thereof is in contact with the shielding layer 520. The first heat transfer member 540 may be disposed between the bracket 332 and the electrical element 510 and may be formed, for example, of a carbon fiber thermal interface material (TIM) to effectively receive heat from the electrical element 510. However, the first heat transfer member 540 is not limited to the carbon fiber TIM, and may include various heat dissipation materials or members for transferring heat generated in the electrical element 510 to the bracket 332. For example, various heat dissipation materials or members may include, for example, and without limitation, a heat pipe, a heat dissipation sheet, a heat dissipation paint, or the like. In this regard, materials of the heat pipe, the heat dissipation sheet, or the heat dissipation paint may include, for example, a high heat conduction material, such as, for example, and without limitation, graphite, a carbon nanotube, a natural recycled material, and silicon. As still another example, the carbon fiber TIM may include, for example, and without limitation, at least one of a liquid phase thermal interface material (TIM) and/or a solid phase thermal interface material (TIM). In various embodiments, the carbon fiber TIM may be formed of the solid phase thermal interface material (TIM).

According to an example embodiment, the first heat transfer member 540 disposed inside the second opening 535 may be adhered by the first conductive adhesive layer 521. For example, the first heat transfer member 540 may be disposed such that at least a portion thereof is in contact with the first conductive adhesive layer 521 and at least another portion thereof is in contact with at least a portion of the bracket 332. The first heat transfer member 540 may quickly and stably transfer heat generated in the electrical element 510 toward the bracket 332 through the second opening 535 formed through the support layer 530. Since the support layer 530 is substantially made of a material having high heat resistance, a heat dissipation function may be deteriorated when the support layer 530 is located on a heat transfer path. For example, in the absence of the second opening 535, it may be difficult to transfer heat generated in the electrical element 510 to the bracket 332 due to the support layer 530. In order to efficiently perform heat transfer, the heat dissipation structure may be configured by forming the second opening 535 penetrating a portion of the support layer 530 having high heat resistance and arranging the first heat transfer member 540 formed of a material having low heat resistance for heat transfer in the opening, so as to efficiently transfer heat generated in the electrical element 510.

The heat dissipation structure 500 according to the disclosure may include the first heat transfer member 540 having a good heat transfer effect disposed on the heat transfer path, except for the support layer 530 and thus may quickly distribute heat generated in the electrical element 510 to the outside of the electronic device through the bracket 332, thereby providing a cooling effect of lowering the temperature around the electrical element 510. In addition, as a portion of the first heat transfer member 540 may be in direct contact with at least a portion of the shielding layer 520, the overall thickness of the heat dissipation structure may be reduced. For example, when the first heat transfer member 540 is disposed in the second opening 535 of the support layer 530, a length of the heat transfer path may be shortened compared to the case in which the first heat transfer member 540 is disposed on the support layer 530. For example, the length of the heat transfer path of heat generated in the electrical element (e.g., AP) may be reduced by approximately 10 µm. Accordingly, the heat resistance is reduced by approximately 0.585° C./W, so that an effect of cooling a temperature of the electrical element (e.g., AP) to approximately 2 to 3° C. (e.g., 2.34° C.) may occur. As still another example, a portion of the insulation sheet 531 of the support layer 530 having a large heat resistance value is removed from the heat transfer path, so that the heat resistance from the electrical element 510 toward the first direction (+Z) can be reduced.

Figure 5B:
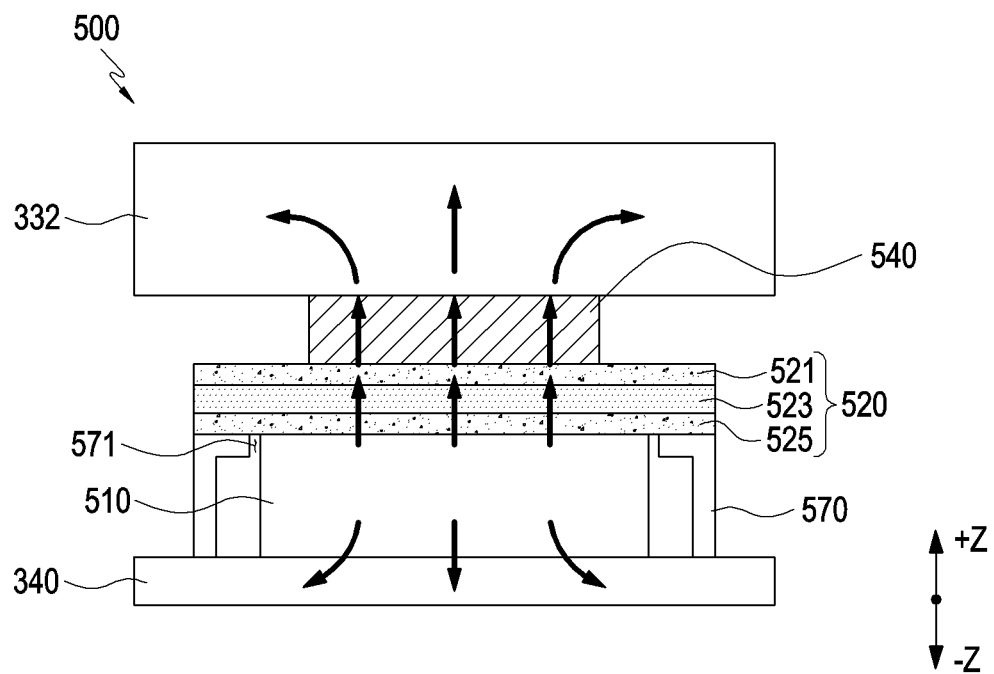
FIG. 5B is a cross-sectional view illustrating an example structure for shielding and dissipating heat around an electrical element, according to various embodiments.

FIG. 5B is a cross-sectional view illustrating an example structure for shielding and dissipating heat around an electrical element, according to an example embodiment.

According to various embodiments, an electronic device (e.g., the electronic device 101 of FIGS. 1 to 4) may include the circuit board 340, at least one electrical element 510, the shield can 570, the shielding sheet (e.g., the shielding layer 520), at least one heat transfer member (e.g., the first heat transfer member 540), and the bracket 332. According to an example embodiment, the elements in FIG. 5B may be partially the same as the elements illustrated in FIG. 5A.

The heat dissipation structure 500 of FIG. 5B may include a shielding sheet made of the shielding layer 520 (e.g., not including the support layer 530), unlike that of FIG. 5A. The shielding layer 520 may include the shielding film 523 and the conductive adhesive films 521 and 525, extend by a region where the support layer (e.g., the support layer 530 of FIG. 5A) is excluded, and thus may efficiently transfer the heat transferred from the electrical element 510.

Figure 6:
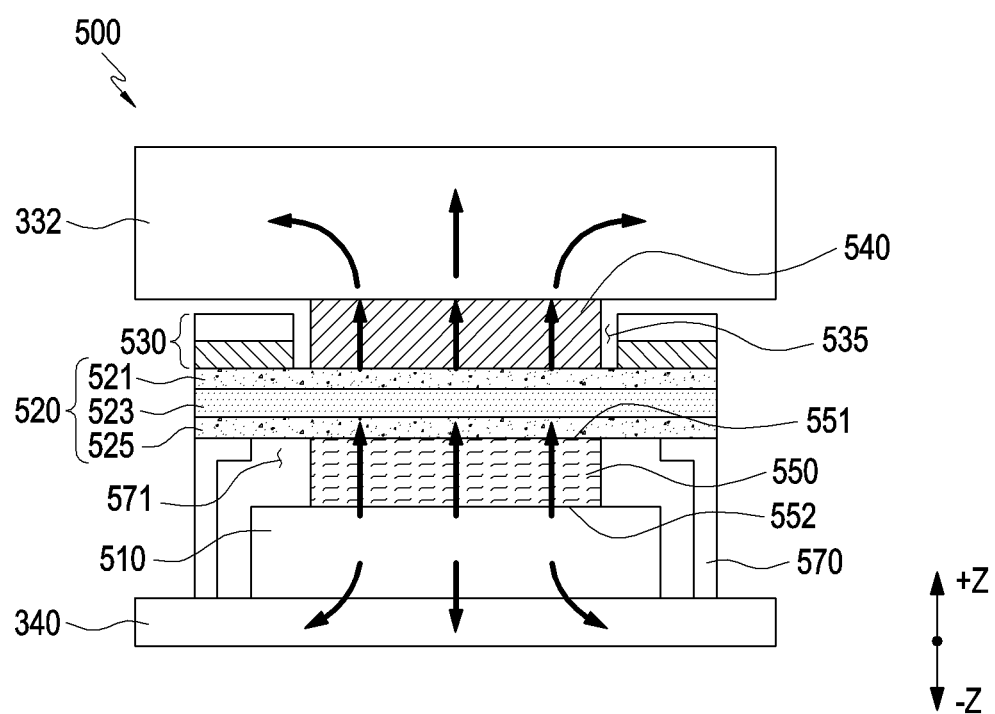
FIG. 6 is a cross-sectional view illustrating an example structure for shielding and dissipating heat around an electrical element, according to various embodiments.

FIG. 6 is a cross-sectional view illustrating an example structure for shielding and dissipating heat around an electrical element, according to another embodiment.

According to various embodiments, an electronic device (e.g., the electronic device 101 of FIGS. 1, 2, 3 and 4) may include the circuit board 340, at least one electrical element 510, the shield can 570, a shielding sheet (the shielding layer 520 and the support layer 530), at least one heat transfer member (e.g., the first heat transfer member 540 and the second heat transfer member 550), and the bracket 332.

In FIG. 6, "+Z or −Z" may refer, for example, to a direction viewed from the side of the heat dissipation structure 500. In addition, in an example embodiment, "+Z" may refer, for example, to a front direction in which the electrical element 510 disposed inside the electronic device faces the front cover (e.g., the front plate 320 of FIG. 4) and "−Z" may refer, for example, to a rear direction in which the electrical element 510 disposed inside the electronic device faces the rear cover (e.g., the rear plate 380 of FIG. 4).

According to an example embodiment, a configuration of the circuit board 340 and the bracket 332 in FIG. 6 may be partially or entirely the same as a configuration of the printed circuit board 340 and the first support member 332 in FIG. 4. A configuration of the at least one electrical element 510, the shield can 570, the shielding layer 520, the support layer 530, and the at least one first heat transfer member 540 in FIG. 6 may be partially or entirely the same as a configuration of the at least one electrical element 510, the shield can 570, the shielding layer 520, the support layer 530, and the at least one first heat transfer member 540 in FIG. 5A. Hereinafter, description will be given focusing on the second heat transfer member 550 which illustrates a difference from FIG. 5A.

According to various embodiments, the second heat transfer member 550 may be disposed between the electrical element 510 and the shielding layer 520 to form the heat transfer path through which heat generated in the electrical element 510 is transferred to the shielding layer 520. The second heat transfer member 550 may be disposed such that at least a portion thereof passes through the first opening 571 of the shield can 570, may have a first surface 551 facing in the first direction (+Z) adhered to a partial region of the shielding film 523 (e.g., one side surface in the downward direction) by the second conductive adhesive film 525, and may be disposed such that a second surface 552 thereof facing in the second direction (−Z) is in direct contact with at least a portion of the electrical element 510.

According to an example embodiment, the second heat transfer member 550 may, for example, be formed of a carbon fiber thermal interface material (TIM) capable of transferring heat generated in the electrical element 510. However, the second heat transfer member 550 is not limited to the carbon fiber TIM and may include various heat dissipation materials or members for transferring heat generated in the electrical element 510 to the bracket 332. For example, various heat dissipation materials or members may include, for example, and without limitation, a thermal interface material (TIM), a heat pipe, a heat dissipation sheet, a heat dissipation paint, or the like. In this regard, materials of the heat dissipation sheet or the heat dissipation paint may include, for example, and without limitation, a high heat conduction material, such as graphite, a carbon nanotube, a natural recycled material, and silicon. As still another example, the carbon fiber TIM may include at least one of a liquid phase thermal interface material (TIM) and/or a solid phase thermal interface material (TIM).

Referring back to FIG. 6, the heat transfer path through which heat generated from the electrical element 510 may be transferred to the bracket 332 may be disposed inside the electronic device by a shielding sheet and at least one heat transfer member. For example, the heat of the electrical element 510 may be transferred to the shielding layer 520 through the second heat transfer member 550 disposed inside the first opening 571 of the shield can 570. The heat transferred to the shielding layer 520 may be transferred to the bracket 332 through the first heat transfer member 540 passing through the second opening 535 of the support layer 530.

Figure 7A:
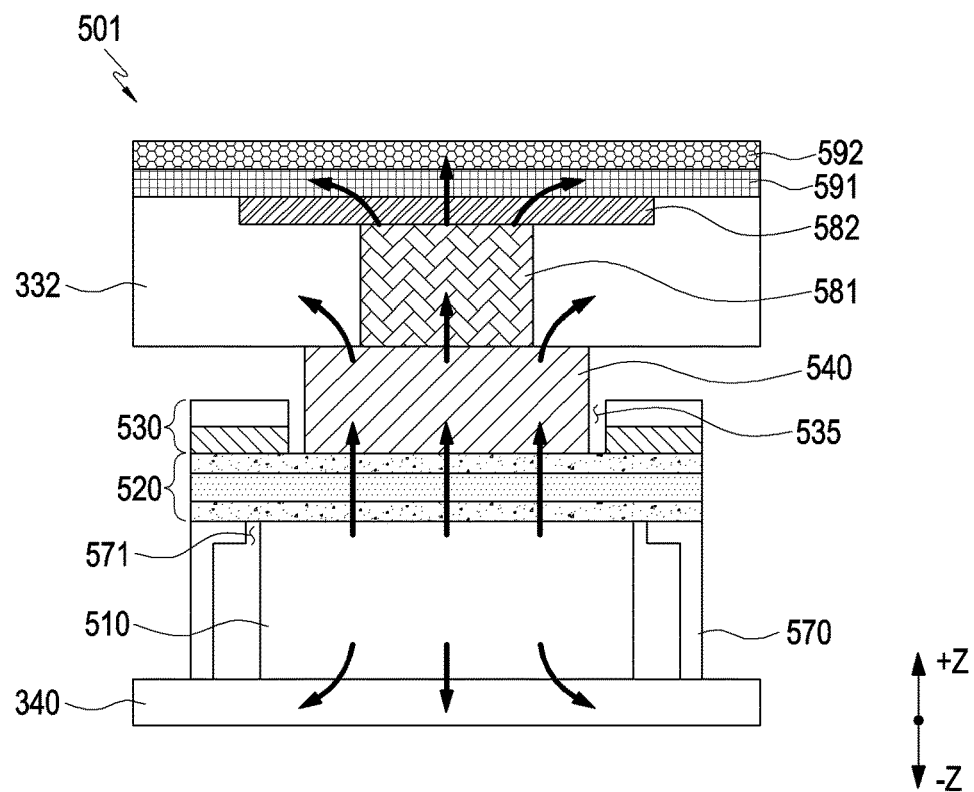
FIG. 7A is a cross-sectional view illustrating an example structure for shielding and dissipating heat around an electrical element, according to various embodiments.
Figure 7B:
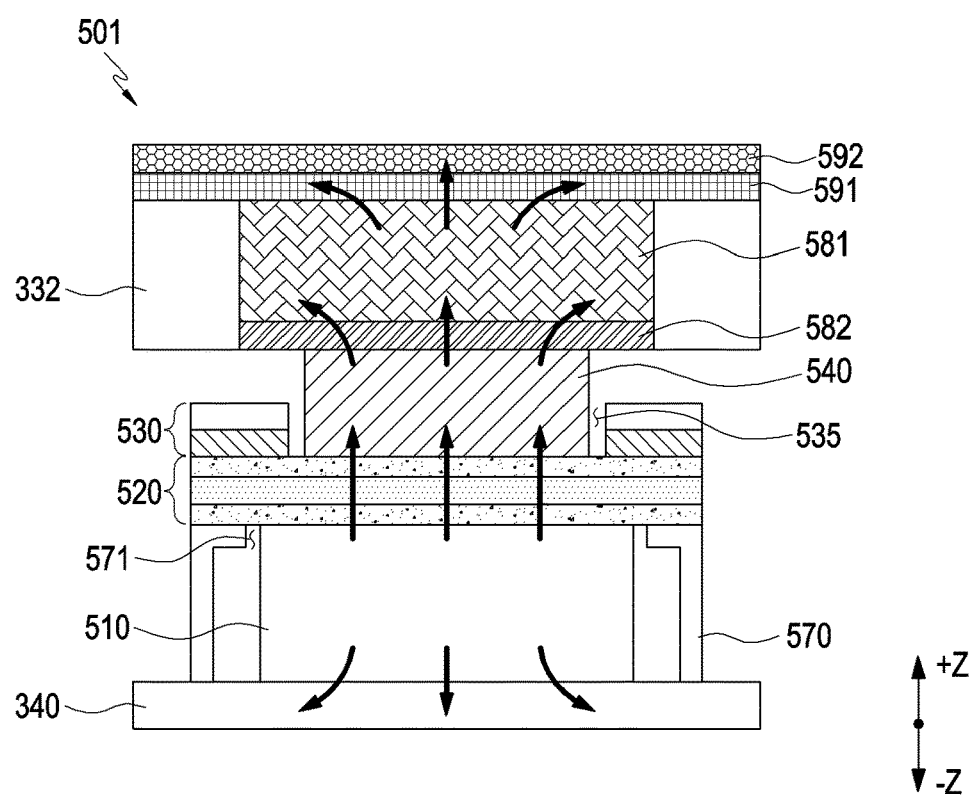
FIG. 7B is a cross-sectional view illustrating an example structure for shielding and dissipating heat around an electrical element, according to various embodiments.

FIG. 7A is a cross-sectional view illustrating an example structure for shielding and dissipating heat around an electrical element, according various embodiments, and FIG. 7B is a cross-sectional view illustrating an example structure for shielding and dissipating heat around an electrical element, according to various embodiments.

According to various embodiments, an electronic device (e.g., the electronic device 101 of FIGS. 1, 2, 3 and 4) may include the circuit board 340, at least one electrical element 510, the shield can 570, the shielding sheet (the shielding layer 520 and the support layer 530), at least one heat transfer member (e.g., the first heat transfer member 540), and the bracket 332. According to still another example, the electronic device 101 may include a plurality of cooling members 581 and 582 and a plurality of heat dissipation sheets 591 and 592 disposed inside and/or adjacent to the bracket 332.

In FIGS. 7A and 7B, "+Z or −Z" may refer, for example, the thickness direction of the heat dissipation structure 501. In addition, in an example embodiment, "+Z" may refer, for example, to a front direction in which the electrical element 510 disposed inside the electronic device faces the front cover (e.g., the front plate 320 of FIG. 4) and "−Z" may refer, for example, to a rear direction in which the electrical element 510 disposed inside the electronic device faces the rear cover (e.g., the rear plate 380 of FIG. 4).

According to an example embodiment, at least a part (e.g., the circuit board 340) of the elements of FIGS. 7A and 7B may be partially or entirely the same as those of FIG. 4 or 5A. Hereinafter, description will be given focusing on the plurality of cooling members 581 and 582 and the plurality of heat dissipation sheets 591 and 592 which show a difference from FIG. 5A.

According to various embodiments, the plurality of cooling members 581 and 582 and the plurality of heat dissipation sheets 591 and 592 may be disposed on at least one surface of the bracket 332 or may be disposed inside the bracket 332. For example, a first heat dissipation sheet 591 and a second cooling member 582 arranged between the second heat dissipation sheet 592 and a first cooling member 581. According to various embodiments, at least a portion of a lower surface of the bracket 332, facing in the second direction (−Z), may be arranged to be in contact with at least a portion of the first heat transfer member 540.

The first heat dissipation sheet 591 may be disposed on at least a portion of an upper surface of the bracket 332, facing in the first direction (+Z). The first heat dissipation sheet 591 may be attached to an upper surface of the bracket 332 in the form of a sheet and may rapidly diffuse heat transferred from the electrical element 510 therethrough. As still another example, the second heat dissipation sheet 592 may be disposed on an upper surface of the first heat dissipation sheet 591 and thus may rapidly diffuse heat together with the first heat dissipation sheet 591. The first heat dissipation sheet 591 and the second heat dissipation sheet 592 may include a material having high heat conductivity and may have different heat conductivity from each other. For example, the first heat dissipation sheet 591 may include, for example, and without limitation, a graphite sheet, and the second heat dissipation sheet 592 may include, for example, and without limitation, polyurethane (PU).

According to various embodiments, the bracket 332 may include an opening or recess structure disposed inside thereof, and the first cooling member 581 and/or the second cooling member 582 may be disposed in at least a portion of the opening or recess structure. Referring to FIG. 7A, the first cooling member 581 may be stably disposed in a recess (e.g., seating groove) formed inside the bracket 332, include at least a partial surface substantially in contact with at least a portion of the first heat transfer member 540, and thus form a heat transfer path. The first cooling member 581 may transfer the heat received from the first heat transfer member 540 to the bracket 332 and/or the second cooling member 582. As still another example, the second cooling member 582 may be disposed between the first cooling member 581 and the first heat dissipation sheet 591.

Referring to FIG. 7B, the second cooling member 582 may be stably disposed in a recess (e.g., seating groove) formed inside the bracket 332, include at least a partial surface substantially in contact with at least a portion of the first heat transfer member 540, and thus form a heat transfer path. The second cooling member 582 may transfer the heat received from the first heat transfer member 540 to the bracket 332 and/or the first cooling member 581. The first cooling member 581 may be disposed between the second cooling member 582 and the first heat dissipation sheet 591. According to still another embodiment, the first cooling member 581 or the second cooling member 582 may be selectively excluded. The first cooling member 581 and the second cooling member 582 may include a material having high heat conductivity and may have different heat conductivity from each other. For example, the first cooling member 581 may include, for example, and without limitation, a water-cooling type heat diffusion member, such as, for example and without limitation, a heat pipe, a vapor chamber, or the like, and the second cooling member 582 may include, for example, and without limitation, a metal plate such as, for example, and without limitation, a copper (Cu) plate.

According to an example embodiment, the heat dissipation structure 501 may include a heat transfer path through which heat generated in the electrical element 510 may be transferred through the bracket 332, the plurality of cooling members 581 and 582, and the plurality of heat dissipation sheets 591 and 592. For example, heat from the electrical element 510 may be transferred to the first opening 571 of the shield can 570 and the shielding layer 520, and heat transferred to the shielding layer 520 may be transferred through the bracket 332, the plurality of cooling members 581 and 582 and the plurality of heat dissipation sheets 591 and 592 after being transferred to the first heat transfer member 540 passing through the second openings 535 of the support layer 530. At least a portion of the heat transferred to the first heat transfer member 540 may be transferred to the outside sequentially through the first cooling member 581, the second cooling member 582, the first heat dissipation sheet 591, and the second heat dissipation sheet 592 so as to cool the electrical element 510. As still another example, heat provided to the first heat dissipation sheet 591, the second heat dissipation sheet 592, the first cooling member 581, and the second cooling member 582 may be transferred to the bracket 332.

Figure 8:
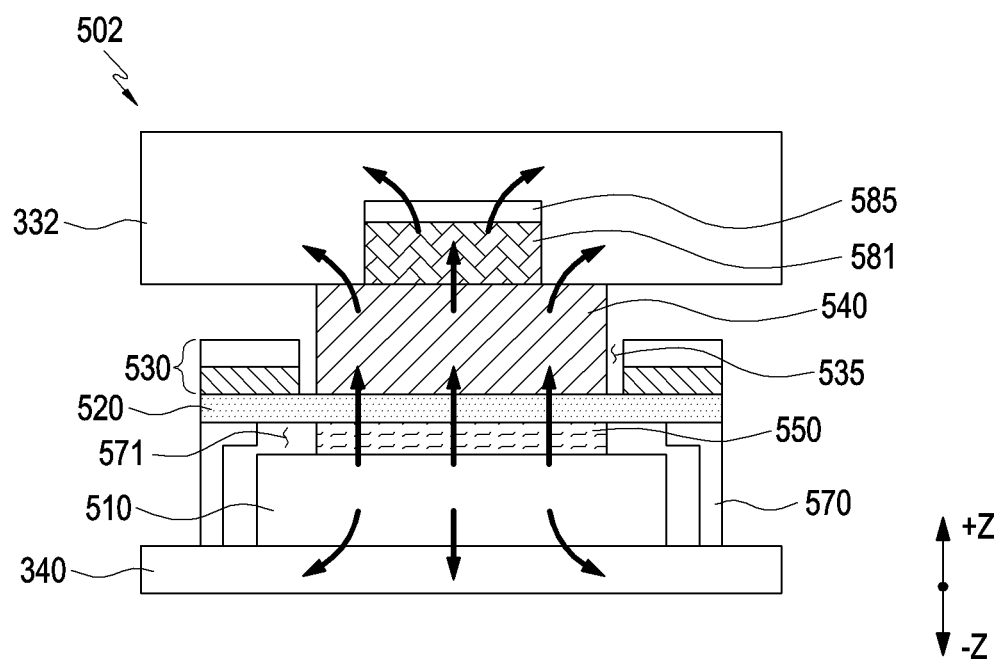
FIG. 8 is a cross-sectional view illustrating an example structure for shielding and dissipating heat around an electrical element, according to various embodiments.
Figure 9:
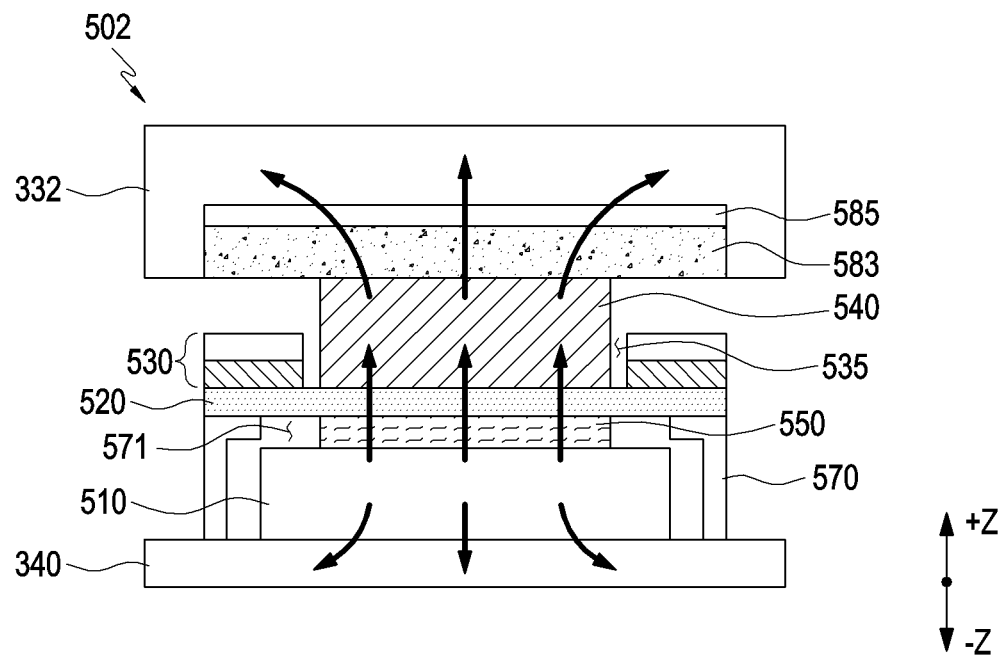
FIG. 9 is a cross-sectional view illustrating an example structure for shielding and dissipating heat around an electrical element, according to various embodiments.

FIG. 8 is a cross-sectional view illustrating an example structure for shielding and dissipating heat around an electric device, according to various embodiments, and FIG. 9 is a cross-sectional view illustrating an example structure for shielding and dissipating heat around an electric device, according to various embodiments.

According to various embodiments, an electronic device (e.g., the electronic device 101 of FIGS. 1, 2, 3 and 4) may include the circuit board 340, at least one electrical element 510, the shield can 570, a shielding sheet (the shielding layer 520, the support layer 530), at least one heat transfer member (e.g., the first heat transfer member 540 and the second heat transfer member 550), and the bracket 332. According to still another example, the electronic device 101 may include the cooling member 581 and/or 583 disposed inside the bracket 332.

According to an example embodiment, the elements of FIGS. 8 and 9 may be partially the same as the elements described in FIG. 4 or 7. Description will be given focusing on a configuration of the cooling member 581 or 583 which is different from the previous drawings.

According to various embodiments, the heat dissipation structure 502 may include the second heat transfer member 550, the shielding layer 520, the first heat transfer member 540, the cooling member 581 or 583, a conductive adhesive member 585, and the bracket 332 which may be sequentially stacked based on the electrical element 510 disposed on the circuit board 340, along the first direction (+Z).

According to various embodiments, the shielding layer 520 may be disposed between the first heat transfer member 540 and the second heat transfer member 550. The first heat transfer member 540 may be partially or entirely the same as a configuration of the first heat transfer member 540 in FIG. 5A. The second heat transfer member 550 may be in contact with at least a portion of the electrical element 510 to transfer heat generated in the electrical element 510 to the shielding layer 520. The second heat transfer member 550 may include at least a portion passing through the first opening 571 of the shield can 570 and may include, for example, and without limitation, a liquid phase thermal interface material (TIM) so as to directly receive heat from the electrical element 510.

According to various embodiments, the cooling member 581 or 583 may be mounted inside the bracket 332, and the conductive adhesive member 585 may be provided to fix the cooling member 581 or 583 to the bracket 332 and efficiently transfer heat. For example, the cooling member 581 or 583 and the conductive adhesive member 585 may be stably placed in a recess (e.g., seating groove) formed inside the bracket 332, and the c cooling member 581 or 583 may have at least a portion in contact with the first heat transfer member 540 to transfer heat. The cooling member 581 or 583 may include, for example, and without limitation, a heat pipe (e.g., the cooling member 581 of FIG. 8), a vapor chamber (e.g., the cooling member 583 of FIG. 9), or the like. The heat pipe and the vapor chamber are one of heat exchangers capable of efficiently transferring heat between two objects by using a property (phase transition) in which heat conductivity and a physical property rapidly change. For example, the heat pipe may be configured in the form of a tube containing copper or aluminum and may serve to transfer heat generated from a heat source to a heat dissipation plate through a liquid stored therein, which has a high heat conductivity. The vapor chamber may disperse heat on the principle in which a heated liquid becomes steam and returns to the liquid again when heat is dispersed therefrom and may effectively disperse heat in a larger area compared to a heat pipe.

The conductive adhesive member 585 may be a structure configured by a conductive tape or soldering so as to fix the cooling member 581 or 583 to the bracket 332 and prevent and/or reduce an increase of heat resistance.

Referring back to FIGS. 8 and 9, the heat dissipation structure 502 may provide a heat path through which heat generated in the electrical element 510 is transferred to the bracket 332 and the cooling member 581 or 583. For example, the heat from the electrical element 510 may be transferred to the shielding layer 520 through the second heat transfer member 550 passing through the first opening 571 of the shield can 570. The heat transferred to the shielding layer 520 may be transferred directly to the bracket 332 after being concentrated in the first heat transfer member 540 passing through the second opening 535 of the support layer 530. As another example, the heat transferred to the first heat transfer member 540 may be diffused to the outside through the cooling member 581 or 583. As still another example, the heat provided to the cooling member 581 or 583 may be transferred to the bracket 332.

Figure 10:
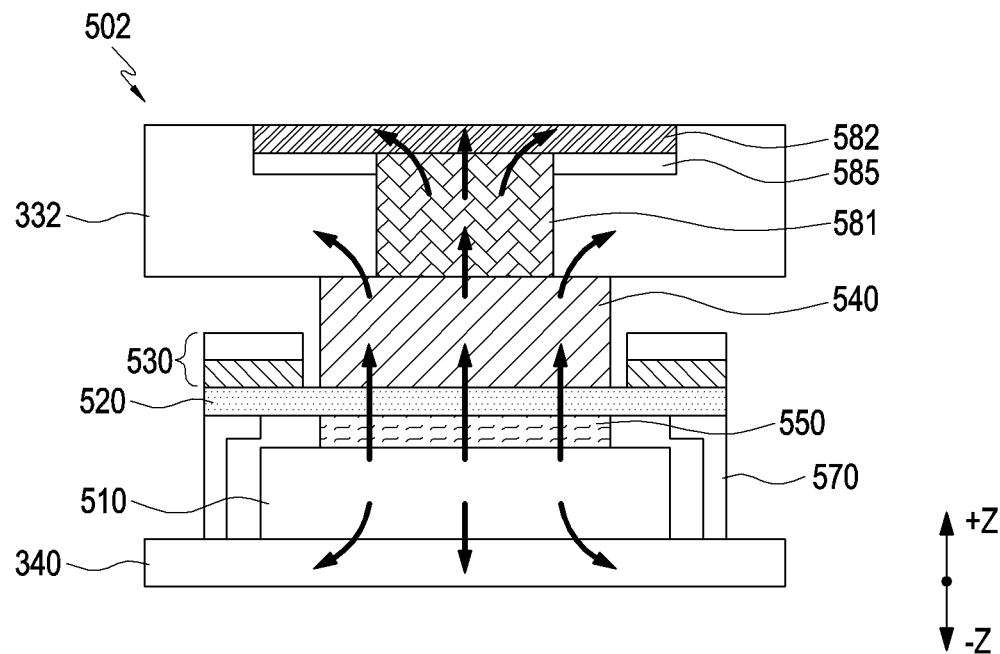
FIG. 10 is a cross-sectional view illustrating an example structure for shielding and dissipating heat around an electrical element, according to various embodiments.

FIG. 10 is a cross-sectional view illustrating an example structure for shielding and dissipating heat around an electrical element, according various embodiments.

According to various embodiments, an electronic device (e.g., the electronic device 101 of FIGS. 1 to 4) may include the circuit board 340, at least one electrical element 510, the shield can 570, the shielding layer 520, the support layer 530, at least one heat transfer member (e.g., the first heat transfer member 540 and the second heat transfer member 550), and the bracket 332. According to still another example, the electronic device 101 may include the bracket 332 and the plurality of cooling members 581 and 582 disposed inside thereof.

According to an example embodiment, the elements of FIG. 10 may be partially the same as the elements described in FIG. 4 or 7. Hereinafter, description will be given focusing on a configuration of the plurality of cooling members 581 and 582 different from the element described in the previous drawings.

According to various embodiments, the heat dissipation structure 502 may include the second heat transfer member 550, the shielding layer 520, the first heat transfer member 540, the first cooling member 581, and the second cooling member 582 which may be sequentially stacked based on the electrical element 510 disposed on the circuit board 340, along the first direction (+Z).

According to various embodiments, the first cooling member 581 and the second cooling member 582 may be mounted inside the bracket 332. The bracket 332 may include an opening or recess structure formed through the inside thereof, and the first cooling member 581 and the second cooling member 582 may be disposed in the opening or recess structure. For example, the first cooling member 581 may be stably placed in a recess (e.g., seating groove) formed inside the bracket 332, include at least a partial surface substantially in contact with the first heat transfer member 540, and thus minimize and/or reduce the heat transfer path.

According to an example embodiment, the conductive adhesive member 585 including a structure configured, for example, by a conductive tape or soldering may be disposed inside the bracket 332, so as to fix the second cooling member 582 to the inside of the bracket 332 and prevent and/or reduce an increase of heat resistance. Referring back to FIG. 10, the heat dissipation structure 502 may provide a heat transfer path through which heat generated in the electrical element 510 is transferred to the bracket 332 and the cooling members 581 and 582. For example, the heat from the electrical element 510 may be transferred to the shielding layer 520 through the second heat transfer member 550 passing through the first opening 571 of the shield can 570. The heat transferred to the shielding layer 520 may be transferred directly to the bracket 332 after being concentrated in the first heat transfer member 540 passing through the second opening 535 of the support member 530. As still another example, heat transferred to the first heat transfer member 540 may be diffused to the outside after being transmitted to the bracket 332 through the first cooling member 581 and/or the second cooling member 582. As still another example, heat provided to the first cooling member 581 and/or the second cooling member 582 may be transferred to the bracket 332, at least a portion of the provided heat may be transferred through the first cooling member 581 and/or the second cooling member 582, or at least a portion of the heat may be transferred back from the bracket 332.

Figure 11:
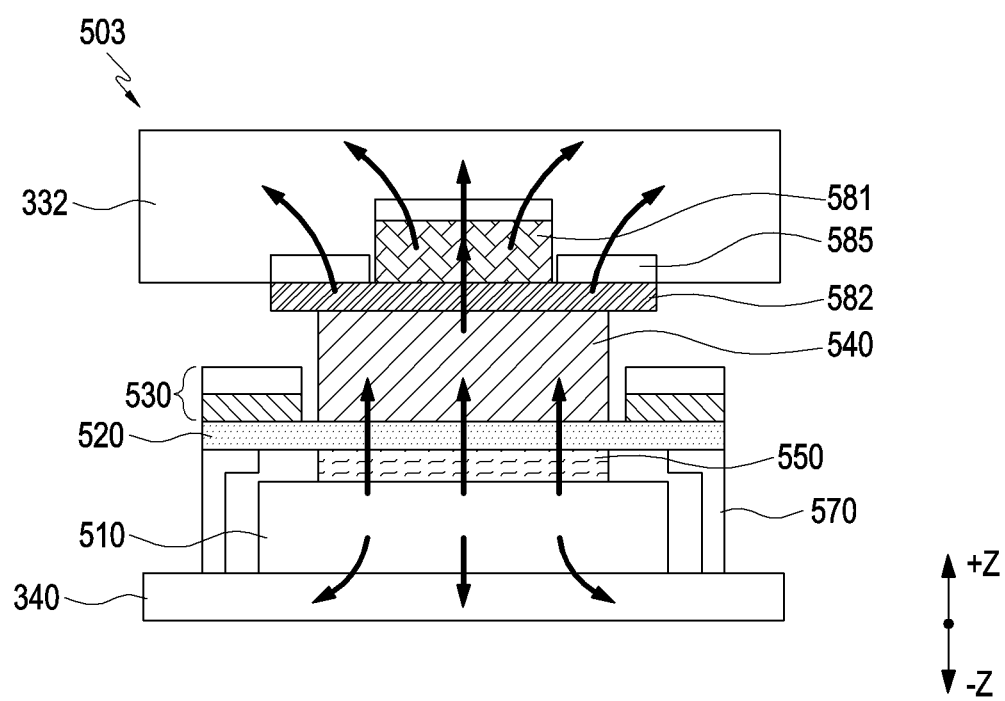
FIG. 11 is a cross-sectional view illustrating an example structure for shielding and dissipating heat around an electrical element, according to various embodiments.

FIG. 11 is a cross-sectional view illustrating an example structure for shielding and dissipating heat around an electrical element, according to various embodiments.

According to various embodiments, an electronic device (e.g., the electronic device 101 of FIGS. 1 to 4) may include the circuit board 340, at least one electrical element 510, the shield can 570, the shielding layer 520, the support layer 530, at least one heat transfer member (e.g., the first heat transfer member 540 and the second heat transfer member 550), and the bracket 332. According to still another example, the electronic device 101 may include a bracket 332 and the plurality of cooling members 581 and 582.

According to an example embodiment, the elements of FIG. 11 may be partially the same as the elements illustrated in FIGS. 4 to 7. Hereinafter, description will be given focusing on a configuration of the plurality of cooling members 581 and 582 which are different from the element described in the previous drawings.

According to various embodiments, the heat dissipation structure 503 may include the second heat transfer member 550, the shielding layer 520, the first heat transfer member 540, the second cooling member 582, and the first cooling member 581 which may be sequentially stacked based on the electrical element 510 disposed on the circuit board 340, along the first direction (+Z).

According to various embodiments, the second cooling member 582 may be disposed between the bracket 332 and the first heat transfer member 540. For example, the second cooling member 582 may be in contact with a lower surface of the bracket 332 and an upper surface of the first heat transfer member 540 and thus may minimize and/or reduce a heat transfer path. The first cooling member 581 may be mounted inside the bracket 332. For example, the first cooling member 581 may be stably placed in a recess (e.g., seating groove) formed inside the bracket 332, include a lower surface substantially in contact with one surface of the second cooling member 582, and thus minimize and/or reduce a heat transfer path.

According to an example embodiment, the conductive adhesive member 585 may be disposed on at least one surface of the first cooling member 581 and the second cooling member 582 so as to fix the same to one side or an inner side of the bracket 332 and prevent and/or reduce an increase of heat resistance. The conductive adhesive member 585 may be a structure configured by a conductive tape or soldering. The conductive adhesive member 585 may be located on an upper surface of the first cooling member 581 and on an upper surface of the second cooling member 582 which are in contact with the bracket 332.

Referring back to FIG. 11, the heat dissipation structure 503 may provide a heat path through which heat generated from the electrical element 510 is transferred to the bracket 332 and cooling members 581 and 582. For example, the heat from the electrical element 510 may be transferred to the shielding layer 520 through the second heat transfer member 550 passing through the first opening 571 of the shield can 570. The heat transferred to the shielding layer 520 may be transferred directly to the bracket 332 after being concentrated in the first heat transfer member 540 and the second cooling member 582 passing through the second opening 535 of the support member 530 or may be transferred to the bracket 332 through the first cooling member 581. As still another example, the heat provided to the first cooling member 581 and/or the second cooling member 582 may be transferred to the bracket 332 or may be transferred back from the bracket 332.

Figure 12:
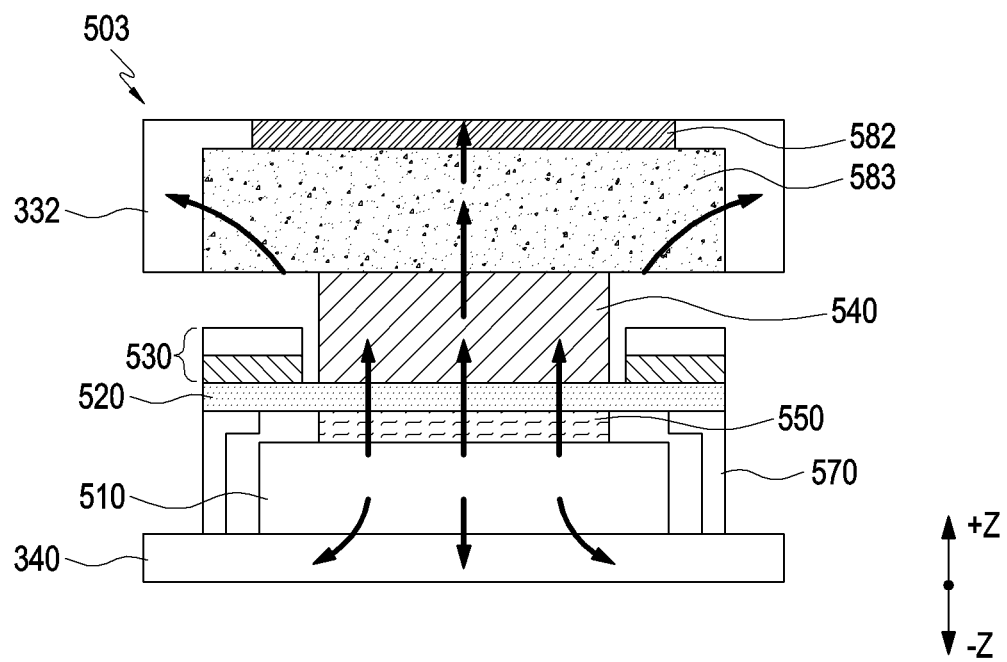
FIG. 12 is a cross-sectional view illustrating an example structure for shielding and dissipating heat around an electrical element, according to a various embodiments.
Figure 13:
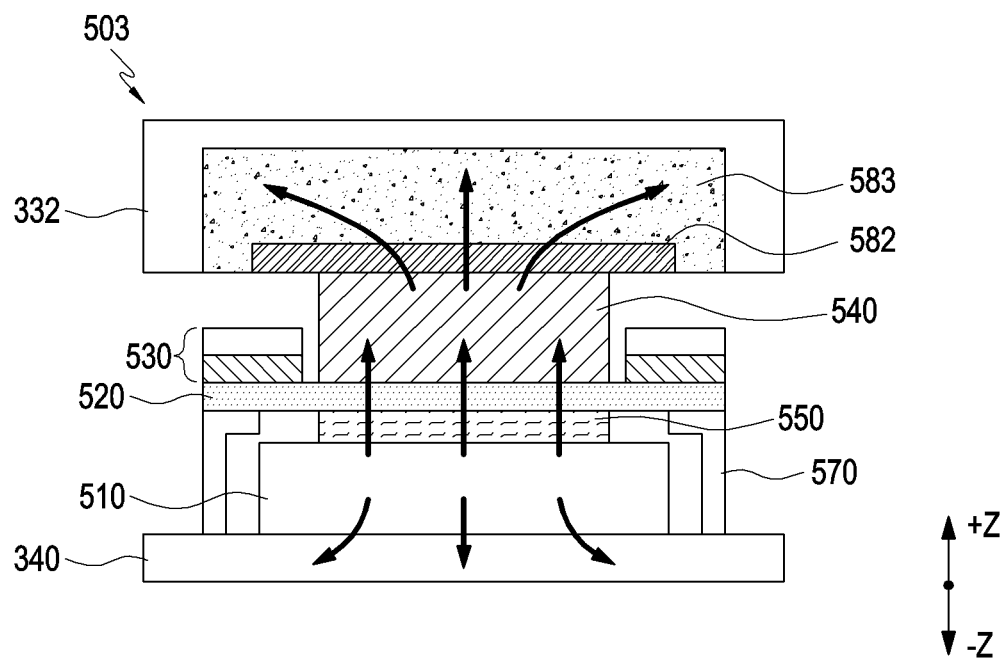
FIG. 13 is a cross-sectional view illustrating an example structure for shielding and dissipating heat around an electrical element, according to various embodiments.

FIG. 12 is a cross-sectional view illustrating an example structure for shielding and dissipating heat around an electric device, according to various embodiments, and FIG. 13 is a cross-sectional view illustrating an example structure for shielding and dissipating heat around an electric device, according to various embodiments.

According to various embodiments, an electronic device (e.g., the electronic device 101 of FIGS. 1, 2, 3 and 4) may include the circuit board 340, at least one electrical element 510, the shield can 570, the shielding layer 520, the support layer 530, at least one heat transfer member (e.g., the first heat transfer member 540 and the second heat transfer member 550), and the bracket 332. According to still another example, the electronic device 101 may include a plurality of cooling members 582 and 583 disposed in the bracket 332.

According to an example embodiment, configurations of FIGS. 12 and 13 may be partially or entirely the same as those of FIG. 4 or 7. Description will be given focusing on a configuration of the cooling members 582 and 583 which show a difference in previous drawings.

According to various embodiments, the heat dissipation structure 503 may include the second heat transfer member 550, the shielding layer 520, the first heat transfer member 540, and the cooling members 582 and 583 which may be sequentially stacked based on the electrical element 510 disposed on the circuit board 340, along the first direction (+Z).

According to various embodiments, the second cooling member 582 and a third cooling member 583 may be mounted inside the bracket 332. The bracket 332 may include an opening or recess structure passing through the inside thereof, and the second cooling member 582 and the third cooling member 583 may be disposed in the opening or recess structure. The second cooling member 582 may include, for example, and without limitation, a metal plate such as, for example, and without limitation, a copper (Cu) plate, and the third cooling member 583 may include, for example, and without limitation, a vapor chamber.

Referring to FIG. 12, the third cooling member 583 may be stably placed in a recess (e.g., seating groove) formed inside the bracket 332, include at least a partial surface substantially in contact with the first heat transfer member 540, and thus minimize and/or reduce the heat transfer path. The second cooling member 582 may be disposed on an upper surface of the third cooling member 583 to diffuse heat transferred from the third cooling member 583 or to transfer the heat to the bracket 332.

Referring to FIG. 13, the third cooling member 583 may be disposed inside the bracket 332 and may include at least one recess formed thereon. The second cooling member 582 may be stably placed in a recess (e.g., seating groove) formed inside the third cooling member 583, include at least a partial surface substantially in contact with the first heat transfer member 540, and thus minimize and/or reduce the heat transfer path. The second cooling member 582 may transfer heat transferred from the first heat transfer member 540 to the third cooling member 583, and the third cooling member 583 may diffuse the heat transferred therefrom or transfer the heat to the bracket 332.

Figure 14:
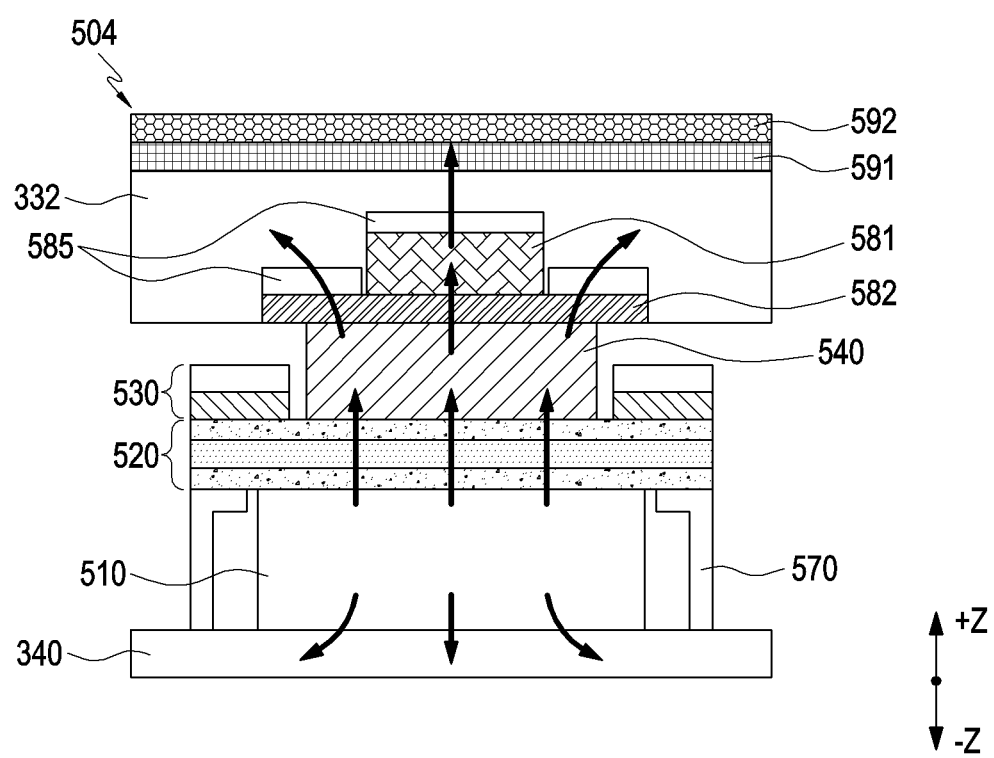
FIG. 14 is a cross-sectional view illustrating an example structure for shielding and dissipating heat around an electrical element, according to various embodiments.
Figure 15:
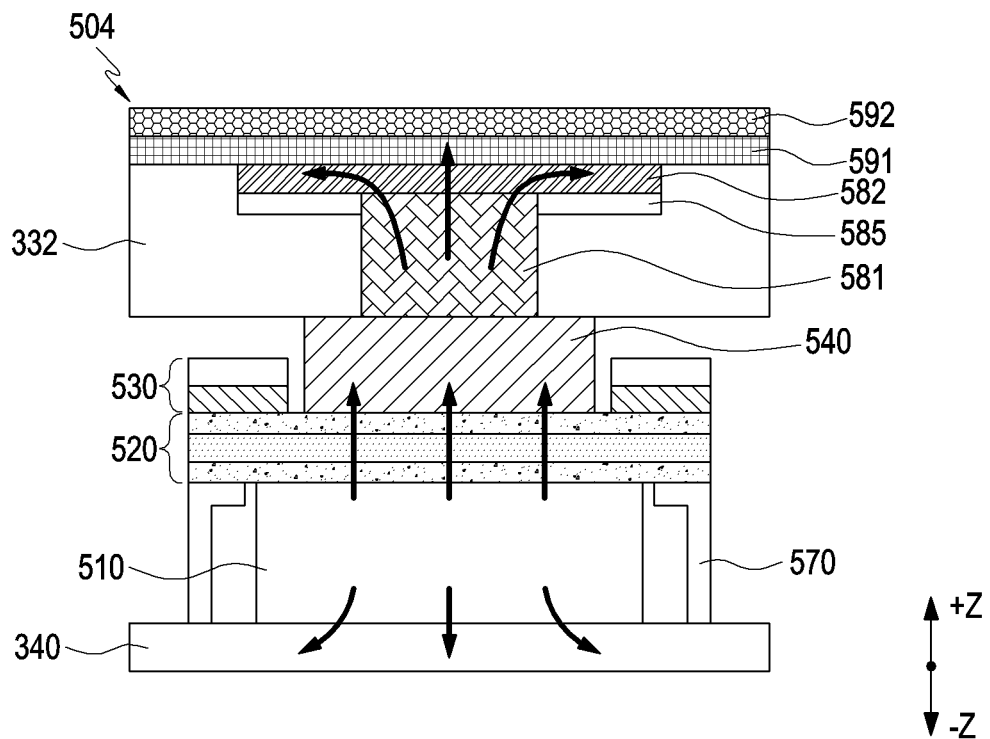
FIG. 15 is a cross-sectional view illustrating an example structure for shielding and dissipating heat around an electrical element, according to various embodiments.

FIG. 14 is a cross-sectional view illustrating an example structure for shielding and dissipating heat around an electric device, according to various embodiments, and FIG. 15 is a cross-sectional view illustrating an example structure for shielding and dissipating heat around an electric device, according to various embodiments.

According to various embodiments, an electronic device (e.g., the electronic device 101 of FIGS. 1, 2, 3 and 4) may include the circuit board 340, at least one electrical element 510, the shield can 570, the shielding layer 520, the support layer 530, at least one heat transfer member (e.g., the first heat transfer member 540), and the bracket 332. According to still another embodiment, the electronic device 101 may include the plurality of cooling members 581 and 582 and the plurality of heat dissipation sheets 591 and 592 which are disposed inside and/or adjacent to the bracket 332.

According to an example embodiment, the elements of FIGS. 14 and 15 may be partially the same as the elements illustrated in FIG. 4 or FIG. 7. Description will be given focusing on a configuration of the plurality of cooling members 581 and 582 and the plurality of heat dissipation sheets 591 and 592 which are different from the elements described in the previous drawings.

According to various embodiments, a heat dissipation structure 504 may include the shielding layer 520, the first heat transfer member 540, the cooling members (e.g., the first cooling member 581 and the second cooling member 582), the bracket 332, the first heat dissipation sheet 591, and the second heat dissipation sheet 592 which may be sequentially stacked based on the electrical element 510 disposed on the circuit board 340, along the first direction (+Z).

According to various embodiments, the first cooling member 581 and the second cooling member 582 may be disposed inside the bracket 332, and the conductive adhesive member 585 including a structure configured by a conductive tape or soldering may be located inside the bracket 332 so as to fix the first cooling member 581 and the second cooling member 582 to the bracket 332 and prevent and/or reduce an increase in the resistance of heat. The first cooling member 581 may, for example, be a heat pipe, and the second cooling member 582 may, for example, be a metal plate such as a copper (Cu) plate.

Referring to FIG. 14, the first cooling member 581 and the second cooling member 582 may be disposed in the recess formed inside the bracket 332, and the second cooling member 582 and the first cooling member 581 may be sequentially disposed on an upper surface of the first heat transfer member 540. The second cooling member 582 may have a relatively large area compared to the first cooling member 581. Referring to FIG. 15, the first cooling member 581 and the second cooling member 582 may pass through the bracket 332. The first cooling member 581 and the second cooling member 582 may be sequentially disposed on an upper surface of the first heat transfer member 540, and the second cooling member 582 may have a relatively large area compared to the first cooling member 581.

According to various embodiments, the first heat transfer member may be in contact with a lower surface of the bracket 332, facing in the second direction (−Z), and the first heat dissipation sheet 591 may be provided on an upper surface of the bracket 332, facing in the first direction (+Z). The first heat dissipation sheet 591 may include at least a portion facing the first heat transfer member 540, attached in the form of a sheet on the top surface of the bracket 332, and thus rapidly diffuse the heat transferred from the electrical element 510. As still another example, the second heat dissipation sheet 592 having a size corresponding, for example, to that of the first heat dissipation sheet 591 may be disposed on an upper surface of the first heat dissipation sheet 591 and thus rapidly diffuse heat together with the first heat dissipation sheet 591. The first heat dissipation sheet 591 and the second heat dissipation sheet 592 may include a material having high heat conductivity and may have different heat conductivity from each other. For example, the first heat dissipation sheet 591 may include, for example, and without limitation, a graphite sheet, and the second heat dissipation sheet 592 may include, for example, and without limitation, a foam containing a material such as, for example, and without limitation, polyurethane (PU).

Referring back to FIGS. 14 and 15, the heat dissipation structure 504 may provide a heat transfer path through which heat generated from the electrical element 510 is transferred to the bracket 332, the plurality of cooling members 581 and 582, and the plurality of heat dissipation sheets 591 and 592. For example, the heat from the electrical element 510 may be transferred to the shielding layer 520 through the first opening 571 of the shield can 570 and the heat transferred to the shielding layer 520 may be directly transferred to the second cooling member 582 or the first cooling member 581 after being concentrated in the first heat transfer member 540 passing through the second opening 535 of the support layer 530. The heat of the second cooling member 582 and the first cooling member 581 may be diffused to the first heat dissipation sheet 591 and the second heat dissipation sheet 592 through the bracket 332.

Figure 16:
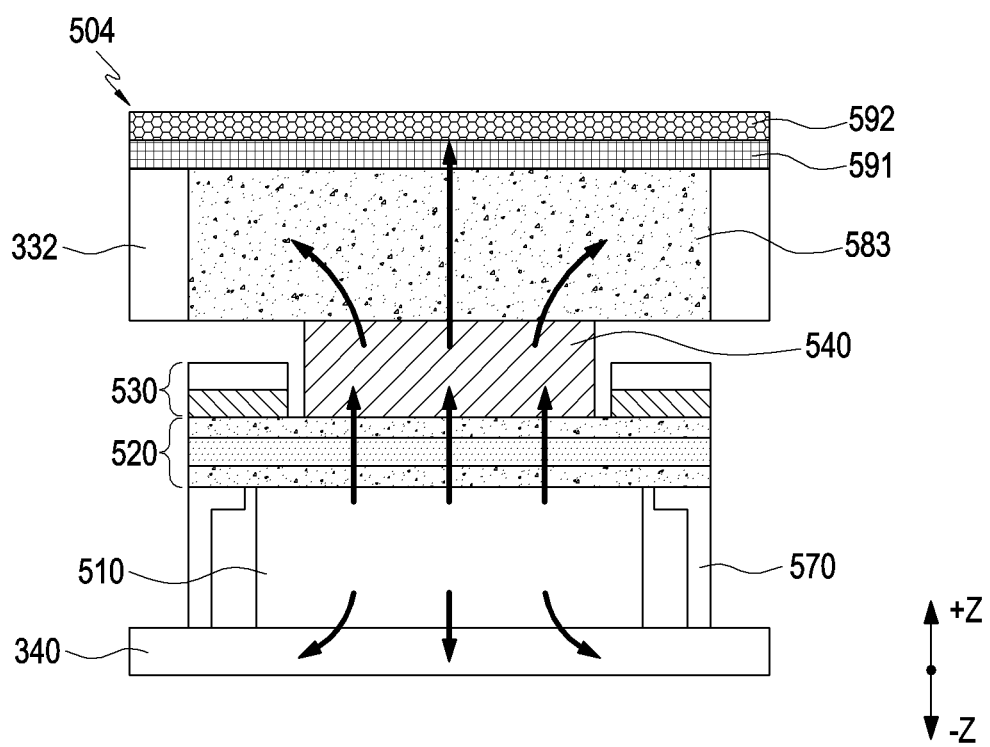
FIG. 16 is a cross-sectional view illustrating an example structure for shielding and dissipating heat, which is disposed around an electrical element, according to various embodiments.

FIG. 16 is a cross-sectional view illustrating an example structure for shielding and heat dissipation disposed around an electrical element, according to various embodiments.

According to various embodiments, an electronic device (e.g., the electronic device 101 of FIGS. 1 to 4) may include the circuit board 340, at least one electrical element 510, the shield can 570, the shielding layer 520, the support layer 530, at least one heat transfer member (e.g., the first heat transfer member 540), and the bracket 332. According to still another example, the electronic device 101 may include the cooling members 583 and the heat dissipation sheets 591 and 592 disposed inside and/or adjacent to the bracket 332.

According to an example embodiment, a configuration of the circuit board 340 and the bracket 332 in FIG. 16 may be partially or entirely the same as that of the printed circuit board 340 and the first support member 332 in FIG. 4. A configuration of at least one electrical element 510, the shield can 570, the shielding layer 520, the support member 530, and the first heat transfer member 540 in FIG. 16 may be partially or entirely the same as that of at least one electrical element 510, the shield can 570, the shielding layer 520, the support member 530, and the first heat transfer member 540 in FIG. 5. A configuration of the plurality of cooling members 583 and the plurality of heat dissipation sheets 591 and 592 in FIG. 16 may be partially or entirely the same as that of the plurality of cooling members 583 in FIG. 9 and the plurality of heat dissipation sheets 591 and 592 in FIG. 7.

According to various embodiments, the heat dissipation structure 504 may include the shielding layer 520, the first heat transfer member 540, the third cooling member 583, the first heat dissipation sheet 591, and the second heat dissipation sheet 592 which may be sequentially stacked based on the electrical element 510 disposed on the circuit board 340, along the first direction (+Z).

According to various embodiments, the third cooling member 583 may be disposed inside the bracket 332, and the third cooling member 583 may pass through the bracket 332 and thus diffuse heat. The third cooling member 583 may be in contact with the first heat transfer member 540 on a lower surface thereof and may be in contact with the first heat dissipation sheet 591 on an upper surface thereof, so that heat resistance may be reduced by the third cooling member 583.

According to various embodiments, the first heat dissipation sheet 591 may be disposed on an upper surface of the third cooling member 583, facing in the first direction (+Z). The first heat dissipation sheet 591 may include at least a portion facing the first heat transfer member 540, attached in the form of a sheet, and thus heat can be rapidly transferred from the electrical element 510 through the third cooling member 583. As still another example, the second heat dissipation sheet 592 may be disposed on an upper surface of the first heat dissipation sheet 591 and thus may rapidly diffuse heat together with the first heat dissipation sheet 591. The first heat dissipation sheet 591 and the second heat dissipation sheet 592 may include a material having high heat conductivity and may have different heat conductivity from each other. For example, the first heat dissipation sheet 591 may include, for example, and without limitation, a graphite sheet, and the second heat dissipation sheet 592 may include, for example, and without limitation, a foam including a material such as, for example, and without limitation, polyurethane (PU).

Figure 17:
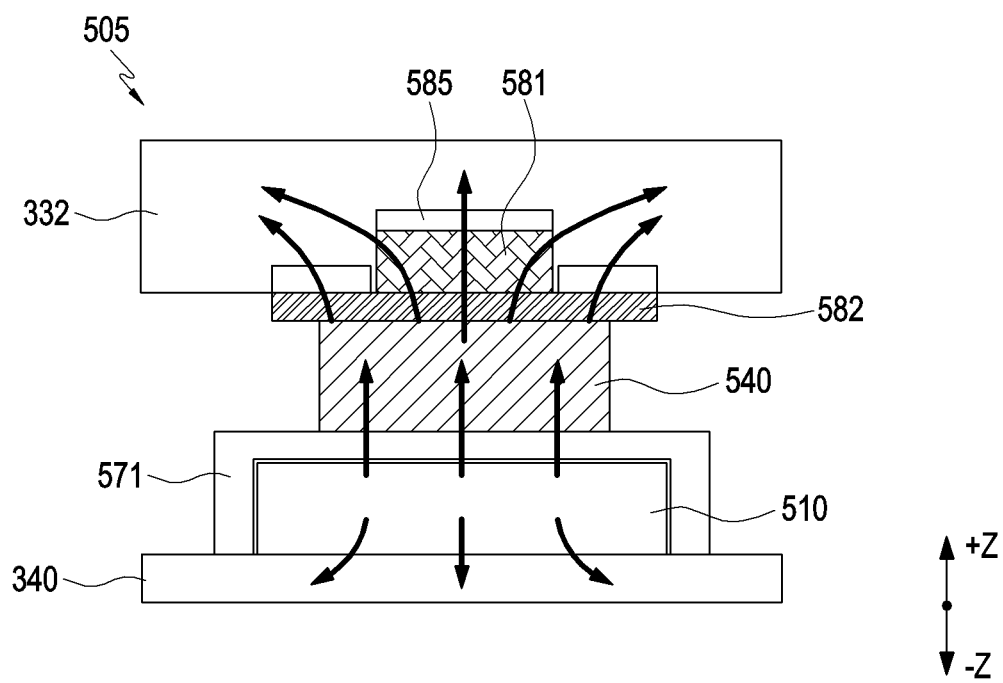
FIG. 17 is a cross-sectional view illustrating an example structure for shielding and dissipating heat around an electrical element, according to various embodiments.
Figure 18:
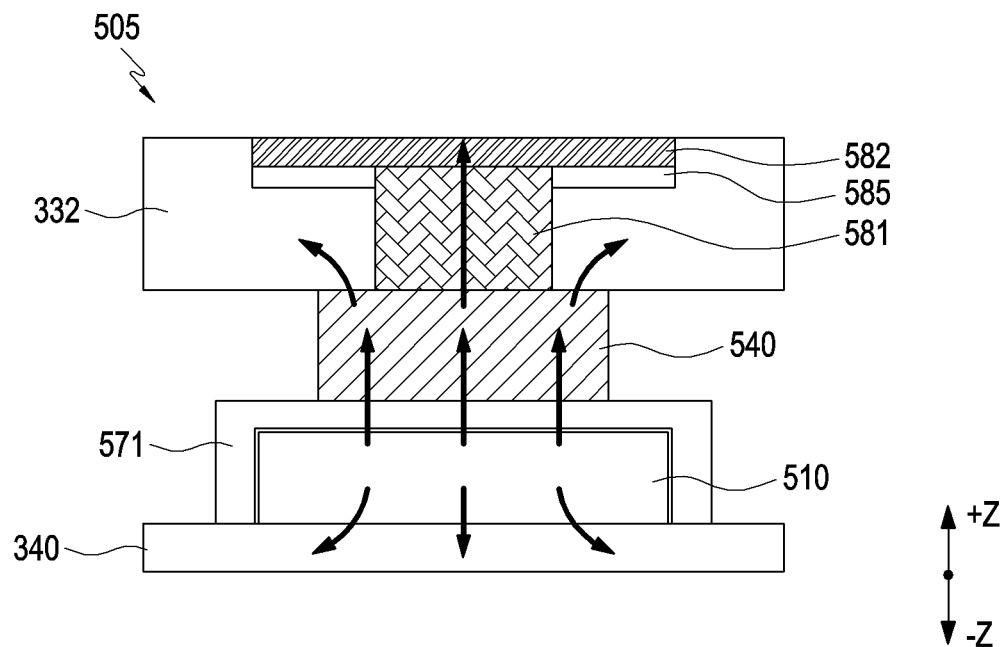
FIG. 18 is a cross-sectional view illustrating an example structure for shielding and dissipating heat around an electrical element, according to various embodiments.
Figure 19:
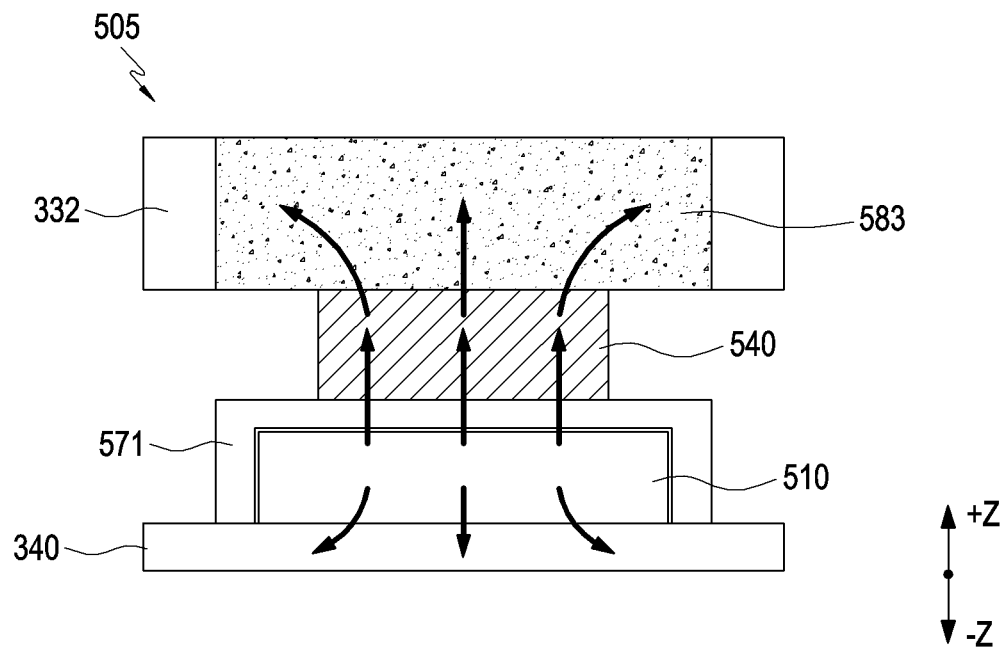
FIG. 19 is a cross-sectional view illustrating an example structure for shielding and dissipating heat around an electrical element, according to various embodiments.

FIG. 17 is a cross-sectional view illustrating an example structure for shielding and dissipating heat around an electric device, according to various embodiments, FIG. 18 is a cross-sectional view illustrating an example structure for shielding and dissipating heat around an electric device, according to various embodiments, and FIG. 19 is a cross-sectional view illustrating an example structure for shielding and dissipating heat around an electric device, according to various embodiments.

According to an example embodiment, the elements of FIGS. 17, 18 and 19 may be partially the same as the elements described in FIG. 4, 11, or 12. Hereinafter, description will be given focusing on a configuration of a shielding structure 571 which is different from the element described in the previous drawings.

Referring to FIG. 17, the heat dissipation structure 505 may include the shielding structure 571, the first heat transfer member 540, the second cooling member 582, the first cooling member 581, and the bracket 332 which may be sequentially stacked based on the electrical element 510 disposed on the circuit board 340, along the first direction (+Z). Unlike the heat dissipation structure 503 of FIG. 11, the second heat transfer member 550 may be excluded from the heat dissipation structure 505 of FIG. 17.

According to various embodiments, the shielding structure 571 may surround at least a portion (e.g., all surfaces except a lower surface) of the electrical elements 510 disposed on the circuit board 340. The shielding structure 571 may be manufactured by directly coating on the upper or side surfaces of the electronic device 510 through a coating process using a shielding coating material, for example, using a nano spray coating process.

According to various embodiments, the first heat transfer member 540, the second cooling member 582, and the first cooling member 581 may be stacked on an upper surface of the shielding structure 571 implemented by a silver nano coating layer. For example, the second cooling member 582 may include a metal plate such as, for example, and without limitation, a copper (Cu) plate, and the first cooling member 581 may include, for example, and without limitation, a heat pipe.

Referring to FIG. 18, the heat dissipation structure 505 may include the shielding structure 571, the first heat transfer member 540, the first cooling member 581, and the second cooling member 582 which may be sequentially stacked based on the electrical element 510 disposed on the circuit board 340, along the first direction (+Z). Unlike the heat dissipation structure 503 of FIG. 11, the second heat transfer member 550 may be excluded from the heat dissipation structure 505 of FIG. 18.

According to various embodiments, the shielding structure 571 may be manufactured by directly coating the upper and side surfaces of the electric device 510 through a nano spray coating process similar to that of the shielding structure of FIG. 17. The first cooling member 581 and the second cooling member 582 may be disposed in the bracket 332, and the conductive adhesive member 585 including a structure configured by a conductive tape or soldering may be disposed in at least a portion of the bracket 332 so as to fix the first heat dissipation member 581 or the second heat dissipation member 582 to the inside of the bracket 332 and prevent and/or reduce an increase of heat resistance. For example, the first cooling member 581 may include, for example, and without limitation, a heat pipe, and the second cooling member 582 may include a metal plate such as, for example, and without limitation, a copper (Cu) plate.

Referring to FIG. 19, the heat dissipation structure 505 may include the shielding structure 571, the first heat transfer member 540, and the third cooling member 583 which may be sequentially stacked based on the electrical element 510 disposed on the circuit board 340, along the first direction (+Z). Unlike the heat dissipation structure 503 of FIG. 12, the second heat transfer member 550 may be excluded from the heat dissipation structure 505 of FIG. 18.

According to various embodiments, the shielding structure 571 may be manufactured by directly coating the upper and side surfaces of the electrical element 510 through a nano spray coating process similar to that of the shielding structure of FIG. 17. The third cooling member 583 may pass through the bracket 332 to directly receive heat from the first heat transfer member 540 and may transfer heat to the bracket 332 or directly diffuse the heat.

Figure 20:
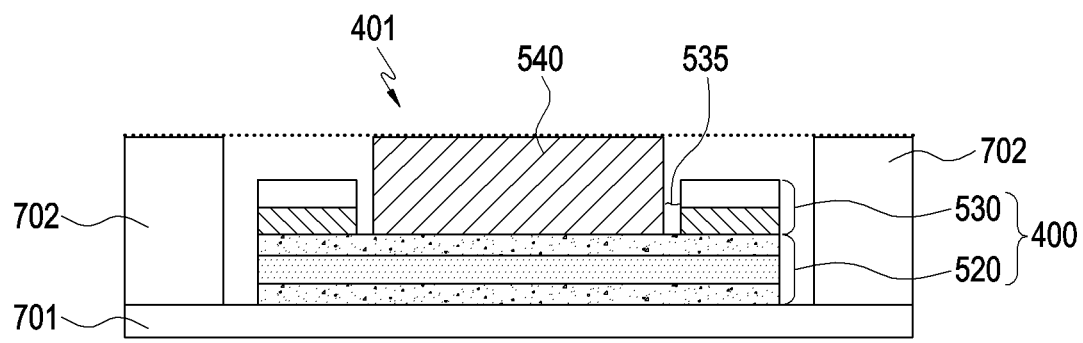
FIG. 20 is a cross-sectional view illustrating an example in which a heat dissipation structure is manufactured, according to various embodiments.
Figure 21:
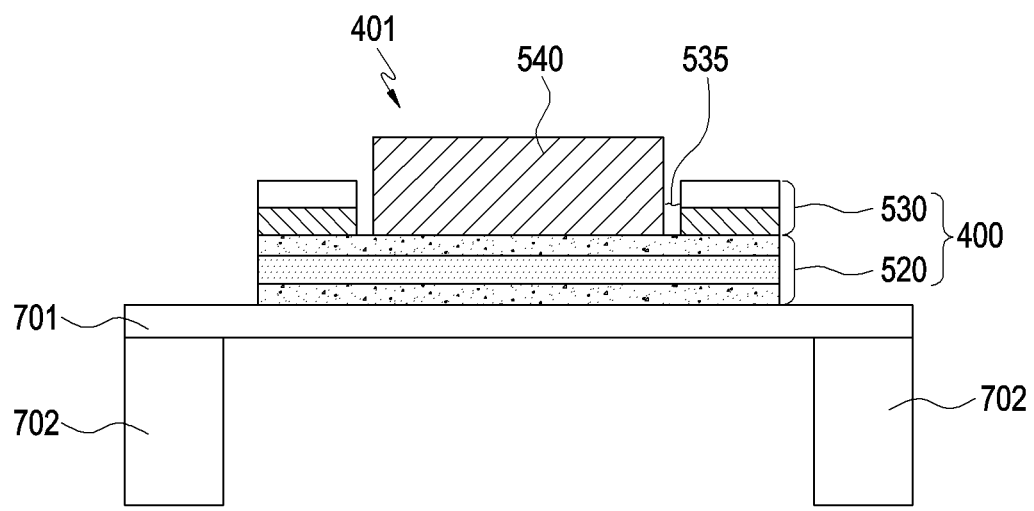
FIG. 21 is a cross-sectional view illustrating an example in which a heat dissipation structure is manufactured, according to various embodiments.

FIG. 20 is a cross-sectional view illustrating an example of manufacturing a heat dissipation structure according to various embodiments, and FIG. 21 is a cross-sectional view illustrating an example of manufacturing a heat dissipation structure according to various embodiments.

According to various embodiments, a heat dissipation assembly 401 for shielding and heat dissipation performance of an electrical element (e.g., the electrical element 510 of FIG. 5A) disposed in an electronic device may include a shielding sheet 400 and a first heat transfer member 540. For example, the shielding sheet 400 and the first heat transfer member 540 may be assembled to a shield can (e.g., the shield can 570 of FIG. 5A) covering the electrical element 510 after being manufactured as one assembly.

According to various embodiments, the shielding sheet 400 may include the shielding layer 520 and the support layer 530 and may be partially or entirely the same as a configuration of the shielding layer 520 and the support layer 400 in FIG. 5A.

Referring to FIG. 20, the shielding layer 520 and the support layer 530 may be stacked on an upper surface of a release paper 701, and the first heat transfer member 540 may be stably placed inside the second opening 535 of the support layer 530. The release paper may be adhered to or attached to a specific adhesion surface and attachment surface. A guide liner 702 may be disposed on an edge of an upper surface of the release paper 701. The guide liner 702 may surround the shielding layer 520, the support layer 530, and the first heat transfer member 540 together with the release paper 701. The guide liner 702 may be configured to be higher than the shielding sheet 400 and the first heat transfer member 540. Then, a reel is wound with reference to the guide liner 702, so that the heat dissipation assembly 401 may be moved onto an automatic line in a state where the shielding sheet 400 and the heat transfer member 540 are protected.

Referring to FIG. 21, the heat dissipation assembly 401 may be moved in a state where the first heat transfer member 540 is protected therein onto an automatic line by arranging the guide liner 702 on an edge of the bottom of the release paper 701 and winding the same on a reel.

According to an example embodiment, the heat dissipation assembly 401 may be moved around the electrical element 510 while being protected by the guide liner 702 and the release paper 701 and then be adhered to the electrical element 510 after the release paper 701 is removed therefrom.

An electronic device (e.g., the electronic device 101 of FIGS. 1, 2, 3 and 4) according to various example embodiments may include: a circuit board (e.g., 340 of FIG. 5A); an electrical element (e.g., 510 of FIG. 5A) disposed on an upper surface of the circuit board; a shield can (e.g., 570 of FIG. 5A) surrounding at least a portion of the electrical element and including a first opening (e.g., 571 of FIG. 5A) provided through a portion of the shield can facing the electrical element; a shielding sheet (e.g., 400 of FIG. 5A) including a shielding layer (e.g., 520 of FIG. 5A) disposed on at least a portion of the shield can and a support layer (e.g., 530) disposed on an upper surface of the shielding layer and including a second opening (e.g., 535 of FIG. 5A) corresponding to the first opening; and a first heat transfer member (e.g., 540 of FIG. 5A) comprising a heat dissipating material and including at least a portion disposed inside the second opening and at least one surface of the first heat transfer member being in contact with the shielding layer.

According to various example embodiments, the electronic device may further include a second heat transfer member (e.g., 550 of FIG. 6) comprising a heat dissipating material disposed between the electrical element and the shielding layer, the second heat transfer member including at least a portion passing through the first opening, and including at least one surface in contact with the electrical element.

According to various example embodiments, the shielding layer may cover the first opening.

According to various example embodiments, the shielding layer may include: a shielding film including a fiber film (e.g., 523 in FIG. 5A); a first conductive adhesive film (e.g., 521 in FIG. 5A); and a second conductive adhesive film (e.g., 525 in FIG. 5A) disposed on both surfaces of the shielding film, respectively. The first conductive adhesive film may adhere an upper surface of the shielding film and the first heat transfer member, and the second conductive adhesive film may adhere a lower surface of the shielding film and an upper surface of the electrical element.

According to various example embodiments, the shielding layer may include: a shielding film (e.g., 523 of FIG. 6) including a fiber film; a first conductive adhesive film (e.g., 521 in FIG. 6); and a second conductive adhesive film (e.g., 525 in FIG. 6) disposed on both surfaces of the shielding film, respectively. The first conductive adhesive film may adhere an upper surface of the shielding film and the first heat transfer member, and the second conductive adhesive film may adhere a lower surface of the shielding film and the second heat transfer member.

According to various example embodiments, the at least one electrical element may include at least one of a power management integrated circuit (PMIC), a power amplifier (PAM), an application processor (AP), a communication processor (CP), and a charging integrated circuit (IC).

According to various example embodiments, the support layer may include a copper (Cu) sheet (e.g., 533 in FIG. 5A) and an insulation sheet (e.g., 531 in FIG. 5A), and the copper sheet may be disposed between the insulation sheet and the shielding layer.

According to various example embodiments, heat generated from the electrical element may be transferred to the shielding layer through the first opening of the shield can, and the heat transferred to the shielding layer may be transferred to the bracket through the first heat transfer member passing through the second opening of the support layer.

According to various example embodiments, heat generated from the electrical element may be transferred to the shielding layer through the second heat transfer member passing through the first opening of the shield can, and the heat transferred to the shielding layer may be transferred to the bracket through the first heat transfer member passing through the second opening of the support layer.

According to various example embodiments, the first heat transfer member and the second heat transfer member comprise a carbon fiber thermal interface material (TIM).

According to various example embodiments, the electronic device may further include at least one cooling member (e.g., 581 and 582 in FIG. 7) disposed inside the bracket, and the cooling member may include at least one of a heat pipe, a copper (Cu) plate, and a vapor chamber.

According to various example embodiments, the electronic device may further include at least one heat dissipation sheet (e.g., 591 and 592 in FIG. 7) disposed on one surface of the bracket, and the heat dissipation sheet may include at least one of a graphite sheet and a foam containing a material such as polyurethane (PU).

According to various example embodiments, the cooling member may include a first cooling member (e.g., 581 in FIG. 7) and a second cooling member (e.g., 582 in FIG. 7), and the first cooling member may be in contact with at least a portion of an upper surface of the first heat transfer member and the second cooling member may be in contact with an upper surface of the first cooling member. The first cooling member and the second cooling member may pass through the bracket.

According to various example embodiments, the electronic device may further include a conductive adhesive member (e.g., 585 in FIG. 8) disposed inside the bracket to fix the at least one cooling member to the bracket and provide a heat transfer path.

According to various example embodiments, the cooling member may include a first cooling member (e.g., 581 in FIG. 13) and a third cooling member (e.g., 583 in FIG. 13), and the third cooling member may surround at least a portion of the first cooling member.

An electronic device (e.g., the electronic device 101 of FIGS. 1, 2, 3 and 4) according to various example embodiments may include: a housing (e.g., 310 in FIGS. 2 and 3); a circuit board (e.g., 340 in FIG. 5A) disposed inside the housing; an electrical element (e.g., 510 in FIG. 5A) disposed on an upper surface of the circuit board; a shield can (e.g., 570 in FIG. 5A) surrounding at least a portion of the electrical element and including a first opening (e.g., 571 in FIG. 5A) provided through a portion of the shield can facing the electrical element; a shielding sheet (e.g., 400 in FIG. 5A) covering the first opening of the shield can and including a recess (e.g., the second opening 535 in FIG. 5A) facing at least a portion of the first opening; and a first heat transfer member (e.g., 540 in FIG. 5A) comprising a heat dissipating material stably disposed in the recess of the shielding sheet and configured to guide a heat transfer path for heat generated in the electrical element to be directed to the housing.

According to various example embodiments, the shielding sheet may include: a shielding film; a first conductive adhesive film disposed on an upper surface of the shielding film; a second conductive adhesive film disposed on a lower surface of the shielding film; and a support layer disposed on an upper surface of the first conductive adhesive film, the support layer including the second opening formed therethrough. The first heat transfer member may be adhered onto the first conductive adhesive film while passing through the second opening.

According to various example embodiments, the second opening may have a closed loop shape and a size corresponding to an area of the electrical element.

According to various example embodiments, the electronic device may further include a second heat transfer member (e.g., 550 in FIG. 6) comprising a heat dissipating material disposed between the electrical element and the shielding layer, having at least a portion passing through the first opening, and having a lower surface in contact with the electrical element.

According to various example embodiments, the electronic device may further include at least one cooling member comprising a heat dissipating material disposed inside the bracket, and at least one heat dissipation sheet disposed on an upper surface of the bracket and having at least a portion facing the first heat transfer member.

An electronic device (e.g., the electronic device 101 of FIGS. 1, 2, 3 and 4) according to various example embodiments may include: a circuit board; an electrical element disposed on an upper surface of the circuit board; a bracket; a shielding sheet disposed between the electrical element and the bracket, the shielding sheet including a shielding layer and a support layer, the support layer being disposed on an upper surface of the shielding layer and including an opening; and a first heat transfer member comprising a heat dissipating material including at least a portion disposed in the opening and at least one surface in contact with the shielding layer.

According to various example embodiments, the electronic device may further include a second heat transfer member comprising a heat dissipating material disposed between the electronic device and the shielding sheet.

A heat dissipation structure and an electronic device including the same according to various embodiments, illustrated above are not limited to the above-described example embodiments and drawings, and it will be apparent to those skilled in the art of the disclosure that various substitutions, modifications, and variations can be made departing from the true spirit and full scope of the disclosure, including the appended claims and their equivalents.

What is claimed is:
1. An electronic device comprising:
a circuit board;
an electrical element disposed on an upper surface of the circuit board;
a shield can surrounding at least a portion of the electrical element and including a first opening formed through a portion of the shield can facing the electrical element;
a shielding sheet comprising a shielding layer disposed on at least a portion of the shield can and a support layer disposed on an upper surface of the shielding layer, the support layer including a second opening at least partially aligned with the first opening; and
a first heat transfer member comprising a first heat dissipating material at least a portion of which is disposed inside the second opening, the first heat transfer member having at least one surface in contact with the shielding layer,
wherein the shielding layer comprises:
a shielding film comprising a fiber film; and
a first conductive adhesive film and a second conductive adhesive film which are disposed on opposite surfaces of the shielding film, respectively, wherein the first conductive adhesive film is adhered to an upper surface of the shielding film and the first heat transfer member, and the second conductive adhesive film is adhered to a lower surface of the shielding film and a surface of the shield can.

2. The electronic device of claim 1, further comprising a second heat transfer member comprising a second heat dissipating material disposed between the electrical element and the shielding layer, the second heat transfer member including at least a portion passing through the first opening, and at least one surface in contact with the electrical element.

3. The electronic device of claim 1, wherein the shielding layer is disposed to cover the first opening.

4. The electronic device of claim 1, wherein
the second conductive adhesive film is adhered to an upper surface of the electrical element.

5. The electronic device of claim 2, wherein the second conductive adhesive film is adhered to the second heat transfer member.

6. An electronic device comprising:
a circuit board;
an electrical element disposed on an upper surface of the circuit board;
a shield can surrounding at least a portion of the electrical element and including a first opening formed through a portion of the shield can facing the electrical element;
a shielding sheet comprising a shielding layer disposed on at least a portion of the shield can and a support layer disposed on an upper surface of the shielding layer, the support layer including a second opening at least partially aligned with the first opening; and
a heat transfer member comprising a first heat dissipating material at least a portion of which is disposed inside the second opening, the heat transfer member having at least one surface in contact with the shielding layer,
wherein the support layer comprises a copper (Cu) sheet and an insulation sheet, and
wherein the copper sheet is disposed between the insulation sheet and the shielding layer.

7. The electronic device of claim 1, further comprising a bracket coupled to the first heat transfer member, wherein heat generated from the electrical element is configured to be transferred to the shielding layer and the first opening of the shield can,
wherein the heat transferred from the shielding layer is configured to transferred to the bracket through the first heat transfer member passing through the second opening of the support layer.

8. The electronic device of claim 2, further comprising a bracket coupled to the first heat transfer member, wherein heat generated from the electrical element is configured to be transferred to the shielding layer through the second heat transfer member passing through the first opening of the shield can,
wherein the heat transferred from the shielding layer is configured to transfer heat transferred to the bracket through the first heat transfer member passing through the second opening of the support layer.

9. The electronic device of claim 2, wherein the first heat transfer member and the second heat transfer member include a carbon fiber thermal interface material (TIM).

10. The electronic device of claim 1, further comprising a bracket coupled to the first heat transfer member and at least one cooling member disposed inside the bracket,
wherein the cooling member includes at least one of a heat pipe, a copper (Cu) plate, and a vapor chamber.

11. The electronic device of claim 1, comprising a bracket coupled to the first heat transfer member and at least one heat dissipation sheet disposed on one surface of the bracket,
wherein the heat dissipation sheet includes at least one of a graphite sheet and a foam including polyurethane (PU).

12. The electronic device of claim 10, wherein the cooling member comprises a first cooling member and a second cooling member,
wherein the first cooling member is in contact with at least a portion of an upper surface of the first heat transfer member, the second cooling member is in contact with an upper surface of the first cooling member, and the first cooling member and the second cooling member are disposed to pass through the bracket.

13. The electronic device of claim 10, further comprising a conductive adhesive disposed inside the bracket and configured to fix the at least one cooling member to the bracket and to provide a heat transfer path.

14. The electronic device of claim 12, wherein the cooling member comprises a first cooling member and a third cooling member,
wherein the third cooling member is configured to surround at least a portion of the first cooling member.

15. An electronic device comprising:
a housing;
a circuit board disposed inside the housing;
an electrical element disposed on an upper surface of the circuit board;
a shield can surrounding at least a portion of the electrical element, the shield can including a first opening provided through a portion of the shield can facing the electrical element;
a shielding sheet covering the first opening of the shield can and including a recess facing at least a portion of the first opening; and
a first heat transfer member comprising a first heat dissipating material stably disposed in the recess of the shielding sheet and configured to guide a heat transfer path for heat generated in the electrical element to be directed to the housing,
wherein the shielding sheet comprises:
a shielding film;
a first conductive adhesive film disposed on an upper surface of the shielding film;
a second conductive adhesive film disposed on a lower surface of the shielding film; and
a support layer disposed on an upper surface of the first conductive adhesive film and including a second opening, wherein the first heat transfer member is adhered onto the first conductive adhesive film and passes through the second opening.

16. The electronic device of claim 15, wherein the second conductive adhesive film is adhered to a surface of the shield can.

17. The electronic device of claim 15, wherein the support layer has a closed loop shape around the second opening and a size of the second opening corresponds to an area of the electrical element.

18. The electronic device of claim 15, further comprising a second heat transfer member comprising a second heat dissipating material disposed between the electrical element and the shielding sheet including at least a portion passing through the first opening, and including a lower surface in contact with the electrical element.

19. An electronic device comprising:
a circuit board;

an electrical element disposed on an upper surface of the circuit board;

a bracket;

a shielding sheet disposed between the electrical element and the bracket, the shielding sheet comprising a shielding layer comprising a shielding fiber film, a first conductive adhesive film and a second conductive adhesive film which are disposed on opposite surfaces of the shielding layer, respectively, and a support layer, wherein the support layer is disposed on an upper surface of the first conductive adhesive film facing the bracket and comprises an opening; and a first heat transfer member comprising a first heat dissipating material and including at least a portion disposed in the opening and at least one surface in contact with the shielding layer, wherein the first conductive adhesive film is adhered to an upper surface of the shielding fiber film and the second conductive adhesive film adhered to a lower surface of the shielding fiber film and is disposed between the lower surface of the shielding layer and the electrical element.

20. The electronic device of claim 19, further comprising a second heat transfer member comprising a second heat dissipating material disposed between the electrical element and the shielding sheet.

* * * * *